United States Patent
Huang et al.

(10) Patent No.: US 11,837,995 B2
(45) Date of Patent: Dec. 5, 2023

(54) ONE-COIL MULTI-CORE INDUCTOR-CAPACITOR OSCILLATOR

(71) Applicant: MEDIATEK INC., Hsin-Chu (TW)

(72) Inventors: Hao-Wei Huang, Hsinchu (TW);
Song-Yu Yang, Hsinchu (TW);
Ang-Sheng Lin, Hsinchu (TW);
Yi-Chien Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/730,221

(22) Filed: Apr. 27, 2022

(65) Prior Publication Data
US 2022/0385233 A1 Dec. 1, 2022

Related U.S. Application Data

(60) Provisional application No. 63/192,613, filed on May 25, 2021.

(51) Int. Cl.
*H03B 5/12* (2006.01)
*H01F 27/28* (2006.01)
(Continued)

(52) U.S. Cl.
CPC .......... *H03B 5/08* (2013.01); *H01F 27/2823* (2013.01); *H01F 27/40* (2013.01); *H03B 5/1265* (2013.01);
(Continued)

(58) Field of Classification Search
CPC ....... H01F 27/2823; H01F 27/40; H03B 5/08; H03B 5/12; H03B 5/1265; H03B 5/1268;
(Continued)

(56) References Cited

U.S. PATENT DOCUMENTS 6,940,355 B2 9/2005 Hajimiri
8,294,528 B2 10/2012 Li
(Continued)

FOREIGN PATENT DOCUMENTS

CN 102577098 A 7/2012
TW I565223 B 1/2017
(Continued)

OTHER PUBLICATIONS

Yiyang Shu, Huizhen Jenny Qian, Xun Luo, "A 2-D Mode-Switching Quad-Core Oscillator Using E-M Mixed-Coupling Resonance Boosting", JSSC, 2020, IEEE, USA.
(Continued)

*Primary Examiner* — Levi Gannon
(74) *Attorney, Agent, or Firm* — Winston Hsu

(57) ABSTRACT

A one-coil multi-core inductor-capacitor (LC) oscillator is provided. The one-coil multi-core LC oscillator includes a main coil and at least one mode suppression device. The main coil includes an outer wire and a central wire, wherein the outer wire is coupled to a first core circuit and a second core circuit, and the central wire is coupled between a first node and a second node of the outer wire. More particularly, an outer loop formed by the outer wire corresponds to a first mode of the one-coil multi-core LC oscillator, and inner loops formed by the outer wire and the central wire correspond to a second mode of the one-coil multi-core LC oscillator, where the at least one mode suppression device is configured to suppress one of the first mode and the second mode.

14 Claims, 17 Drawing Sheets

(51) Int. Cl.
*H01F 27/40* (2006.01)
*H03B 5/08* (2006.01)

(52) U.S. Cl.
CPC ..... *H03B 5/1268* (2013.01); *H03B 2200/009* (2013.01)

(58) Field of Classification Search
CPC .. H03B 5/1296; H03B 5/1847; H03B 5/1852; H03B 2200/009
See application file for complete search history.

(56) References Cited

U.S. PATENT DOCUMENTS

| | | | |
|---|---|---|---|
| 9,735,732 B1* | 8/2017 | Ferriss | H03B 5/1265 |
| 10,396,711 B2 | 8/2019 | Wu | |
| 11,025,198 B2 | 6/2021 | Shahmohammadi | |
| 2004/0124931 A1* | 7/2004 | Hajimiri | H03B 5/1852 331/36 L |
| 2008/0284534 A1 | 11/2008 | El Rai | |
| 2009/0289727 A1* | 11/2009 | El Rai | H03B 5/1243 331/46 |
| 2012/0154073 A1 | 6/2012 | Lee | |
| 2013/0157584 A1* | 6/2013 | Tekin | H03B 5/1228 331/109 |
| 2017/0141728 A1* | 5/2017 | Chen | H03B 5/1228 |
| 2017/0244361 A1* | 8/2017 | Farazian | H03B 5/1212 |
| 2018/0270762 A1 | 9/2018 | Ayraud | |
| 2020/0153386 A1* | 5/2020 | Djahanshahi | H03B 5/1212 |
| 2021/0036659 A1* | 2/2021 | Pallotta | H04B 1/40 |

FOREIGN PATENT DOCUMENTS

| | | |
|---|---|---|
| WO | 2011/040846 A1 | 4/2011 |
| WO | 2012/154098 A1 | 11/2012 |

OTHER PUBLICATIONS

David Murphy, Hooman Darabi, "A 27-GHz Quad-Core CMOS Oscillator With No Mode Ambiguity", JSSC, Nov. 2018, IEEE, USA.

Guansheng Li, Ehsan Afshari, "A Distributed Dual-Band LC Oscillator Based on Mode Switching", Transactions on Microwave Theory and Techniques, Jan. 2011, IEEE, USA.

Guansheng Li, Li Liu, Yiwu Tang, Ehsan Afshari, "A Low-Phase-Noise Wide-Tuning-Range Oscillator Based on Resonant Mode Switching", JSSC, Jun. 2012, IEEE, USA.

Mazhareddin Taghivand, Kamal Aggarwal, Ada S. Y. Poon, "A 3.24-to-8.45GHz low-phase-noise mode-switching oscillator", ISSCC, 2014, IEEE, USA.

Mina Shahmohammadi, Masoud Babaie, Robert Bogdan Staszewski, "Tuning Range Extension of a Transformer-Based Oscillator Through Common-Mode Colpitts Resonance", Transactions on Circuits and Systems-I: Regular Papers, 2017, IEEE, USA.

R. Aparicio, A. Hajimiri, "Circular-Geometry Oscillators", ISSCC, 2004, IEEE, USA.

Zhiming Deng, Ali M. Niknejad, "A 4-Port-Inductor-Based VCO Coupling Method for Phase Noise Reduction", JSSC, Aug. 2011, IEEE, USA.

* cited by examiner

ONE-COIL MULTI-CORE INDUCTOR-CAPACITOR OSCILLATOR

CROSS REFERENCE TO RELATED APPLICATIONS

This application claims the benefit of U.S. provisional application No. 63/192,613, which was filed on May 25, 2021, and is included herein by reference.

BACKGROUND

The present invention is related to inductor-capacitor (LC) oscillators, and more particularly, to a one-coil multi-core LC oscillator.

For an LC oscillator, it is required to reduce an equivalent inductance of an inductor within the LC oscillator for reducing phase noise of the LC oscillator. Typically, directly reducing an inductance of the inductor by shrinking a dimension of the inductor will cause quality factor degradation of the inductor. Thus, phase noise reduction is hard to be achieved by shrinking the dimension of the inductor. Related arts provide some methods to reduce the equivalent inductance without shrinking the dimension of the inductor. There are some disadvantages, however. For example, an overall circuit area of the proposed architecture of a related art needs to be doubled if 3-decibel (dB) phase noise reduction is required.

In addition, it is challenging to design an LC oscillator with a wide tuning range. For example, an equivalent inductance of an inductor within a wide tuning range LC oscillator is designed to be switchable for increasing an overall tuning range of an oscillation frequency of the wide tuning range LC oscillator. It is not preferred to directly control the dimension of the inductor by any switch connected between segments of the inductor, as this configuration results in quality factor degradation.

Thus, there is a need for a novel architecture and an associated mode control method for an LC oscillator, which can improve the phase noise reduction and increase the overall tuning range without introducing any side effect or in a way that is less likely to introduce side effects.

SUMMARY

One of objectives of the present invention is to provide a one-coil multi-core inductor-capacitor (LC) oscillator, which can improve the phase noise reduction without greatly increase additional costs (e.g., circuit area).

Another objective of the present invention is to provide a one-coil multi-core LC oscillator, which can make an equivalent inductance of the multi-core LC oscillator be switchable without making the quality factor degrade.

At least one embodiment of the present invention provides a one-coil multi-core LC oscillator. The one-coil multi-core LC) oscillator may comprise a main coil and at least one mode suppression device. The main coil may comprise an outer wire and a central wire, where the outer wire is coupled to a first core circuit and a second core circuit of the one-coil multi-core LC oscillator, and the central wire is coupled between a first node and a second node of the outer wire. More particularly, an outer loop formed by the outer wire corresponds to a first mode of the one-coil multi-core LC oscillator, and inner loops formed by the outer wire and the central wire correspond to a second mode of the one-coil multi-core LC oscillator, where the at least one mode suppression device, configured to suppress one of the first mode and the second mode.

At least one embodiment of the present invention provides a one-coil multi-core LC oscillator. The one-coil multi-core LC oscillator may comprise a main coil. The main coil may comprise an outer wire and a central wire, where the outer wire is coupled to a first core circuit and a second core circuit of the one-coil multi-core LC oscillator, and the central wire is coupled between a first node and a second node of the outer wire. More particularly, the central wire may comprise at least one bended segment.

At least one embodiment of the present invention provides a one-coil multi-core LC oscillator. The one-coil multi-core LC oscillator may comprise a main coil. The main coil may comprise an outer wire and a central wire, where the outer wire is coupled to a first core circuit and a second core circuit of the one-coil multi-core LC oscillator, and the central wire is coupled between a first node and a second node of the outer wire. More particularly, a first segment of the outer wire is coupled between a first terminal of the first core circuit and a first terminal of the second core circuit, a second segment of the outer wire is coupled between a second terminal of the first core circuit and a second terminal of the second core circuit, and a resistance of each of the first segment and the second segment of the outer wire is greater than a resistance of the central wire.

At least one embodiment of the present invention provides a one-coil multi-core LC oscillator. The one-coil multi-core LC oscillator may comprise a main coil. The main coil may comprise an outer wire and a central wire, where the central wire is coupled between a first node and a second node of the outer wire. More particularly, the outer wire may comprise a first sub-coil and a second sub-coil, where the first sub-coil is coupled between a first terminal of a first core circuit and a first terminal of a second core circuit, and the second sub-coil, coupled between a second terminal of the first core circuit and a second terminal of the second core circuit. In addition, the first sub-coil is concentric with the second sub-coil.

The one-coil multi-core LC oscillator (e.g., the design of the main coil and the mode suppression device within the one-coil multi-core LC oscillator) provided by the embodiments of the present invention can reduce an equivalent inductance of an LC oscillator with aid of the multi-core architecture, to thereby reduce the phase noise without greatly increase overall costs. Furthermore, the resonance capacitors and the mutual coil can be utilized in the first mode (e.g., a high frequency band mode) and the second mode (e.g., a low frequency band mode), respectively, in order to suppress unwanted coexisting mode(s), thereby making the tuning range of the multi-core LC oscillator be switchable without mode ambiguity. In addition, the embodiment of the present invention will not greatly increase overall costs (e.g., the circuit area) and almost not affect inductor performance (e.g., inductance and quality factor) in operations modes. Thus, the present invention can improve the phase noise reduction and increase the overall tuning range without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
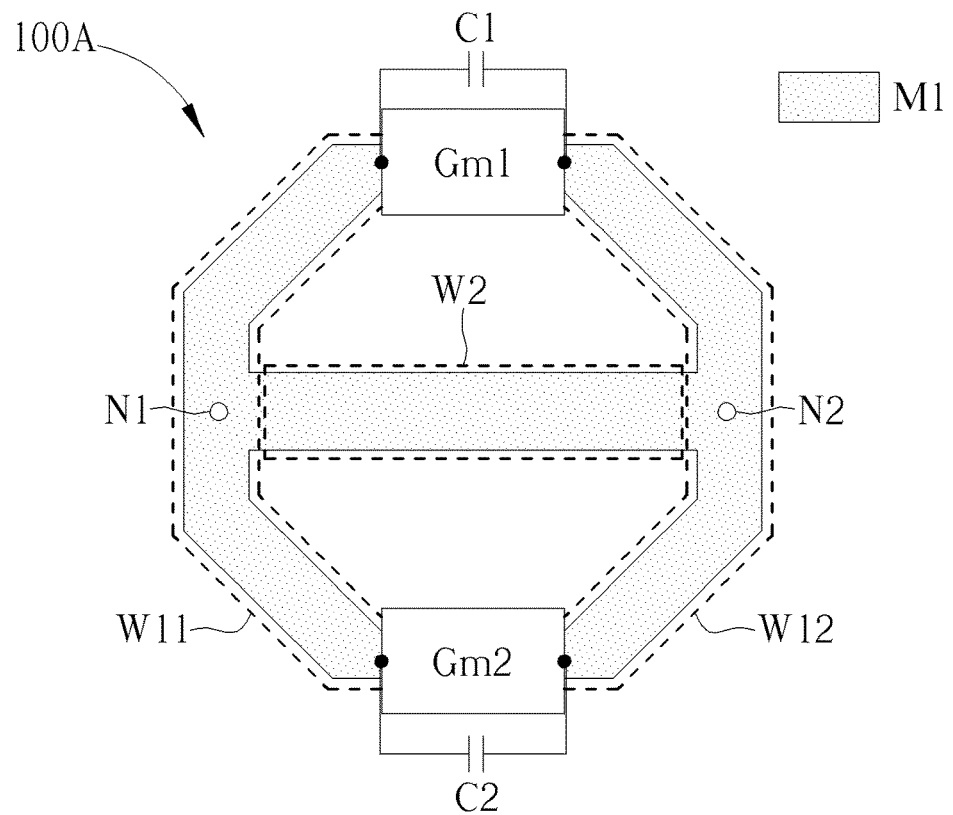
FIG. 1A is a diagram illustrating a one-coil multi-core inductor-capacitor (LC) oscillator according to an embodiment of the present invention.

FIG. 1A is a diagram illustrating a one-coil multi-core inductor-capacitor (LC) oscillator 100A according to an embodiment of the present invention. As shown in FIG. 1A, the one-coil multi-core LC oscillator 100A may comprise a main coil which is illustrated by a metal layer M1. The main coil may comprise an outer wire such as outer wires W11 and W12 and a central wire W2. The outer wires W11 and W12 are coupled to a first core circuit (which comprises a transconductance device Gm1 and a tank capacitor C1) and a second core circuit (which comprises a transconductance device Gm2 and a tank capacitor C2). In particular, a first segment of the outer wire (e.g., the outer wire W11) is coupled between a first terminal of the first core circuit (e.g., a left-side terminal of the transconductance device Gm1 shown in FIG. 1A) and a first terminal of the second core circuit (e.g., a left-side terminal of the transconductance device Gm2 shown in FIG. 1A), and a second segment of the outer wire (e.g., the outer wire W12) is coupled between a second terminal of the first core circuit (e.g., a right-side terminal of the transconductance device Gm1 shown in FIG. 1A) and a second terminal of the second core circuit (e.g., a right-side terminal of the transconductance device Gm2 shown in FIG. 1A). The central wire W2 is coupled between a node N1 of the outer wire W11 and a node N2 of the outer wire W12. In this embodiment, a resistance of each of the first segment and the second segment of the outer wire (e.g., a resistance of each of the outer wires W11 and W12) can be greater than a resistance of the central wire W2, and therefore the main coil allows the one-coil multi-core LC oscillator 100A to operate in both of a first mode (e.g., a high band mode corresponding to the relative low equivalent inductance) and a second mode (e.g., a low band mode corresponding to the relative high equivalent inductance).

Figure 1B:
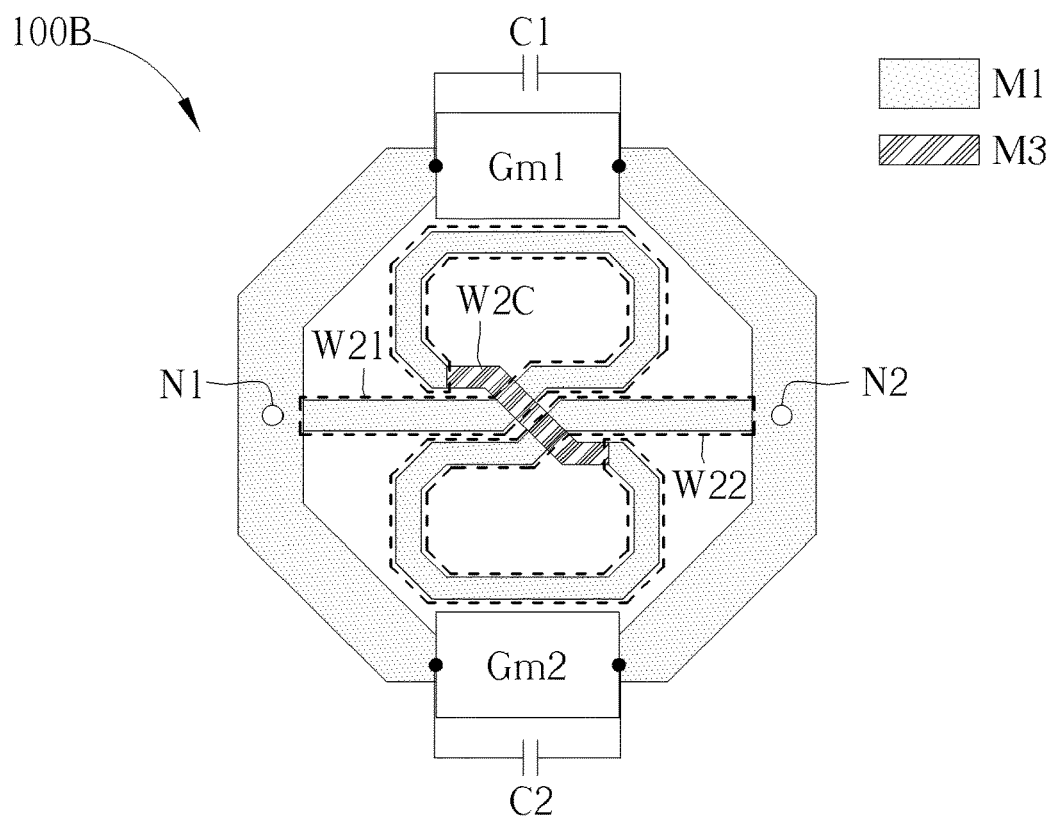
FIG. 1B is a diagram illustrating a one-coil multi-core LC oscillator according to an embodiment of the present invention.
Figure 1C:
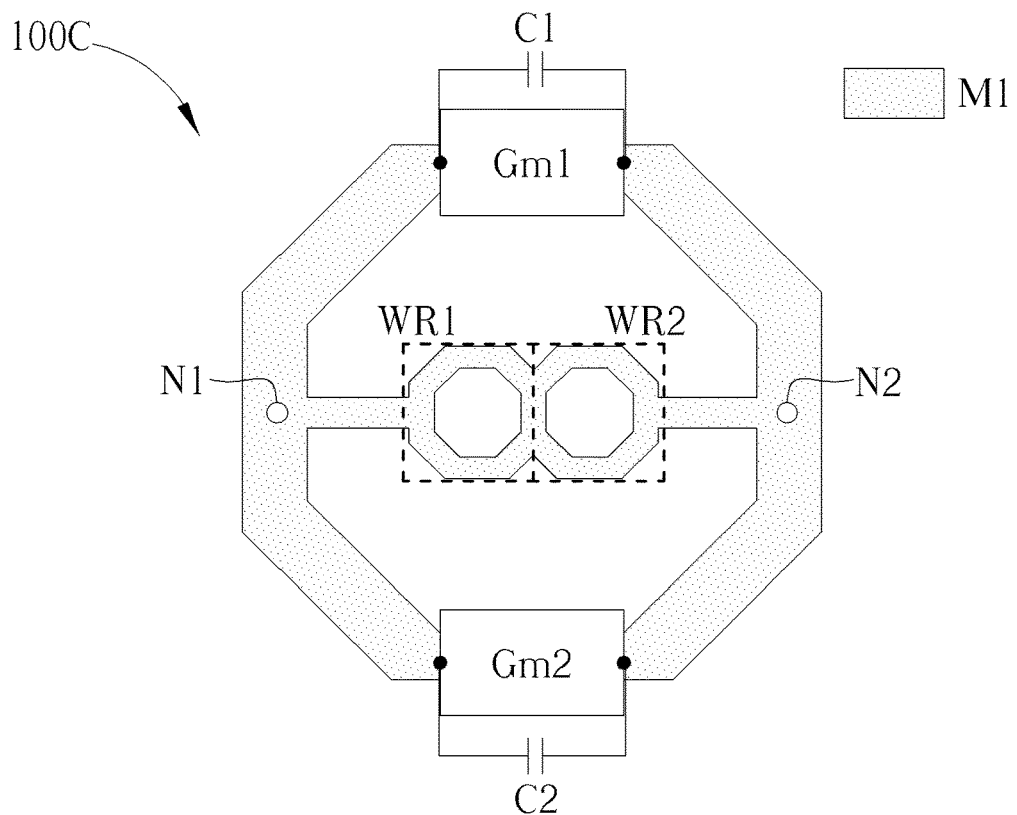
FIG. 1C is a diagram illustrating a one-coil multi-core LC oscillator according to an embodiment of the present invention.
Figure 1D:
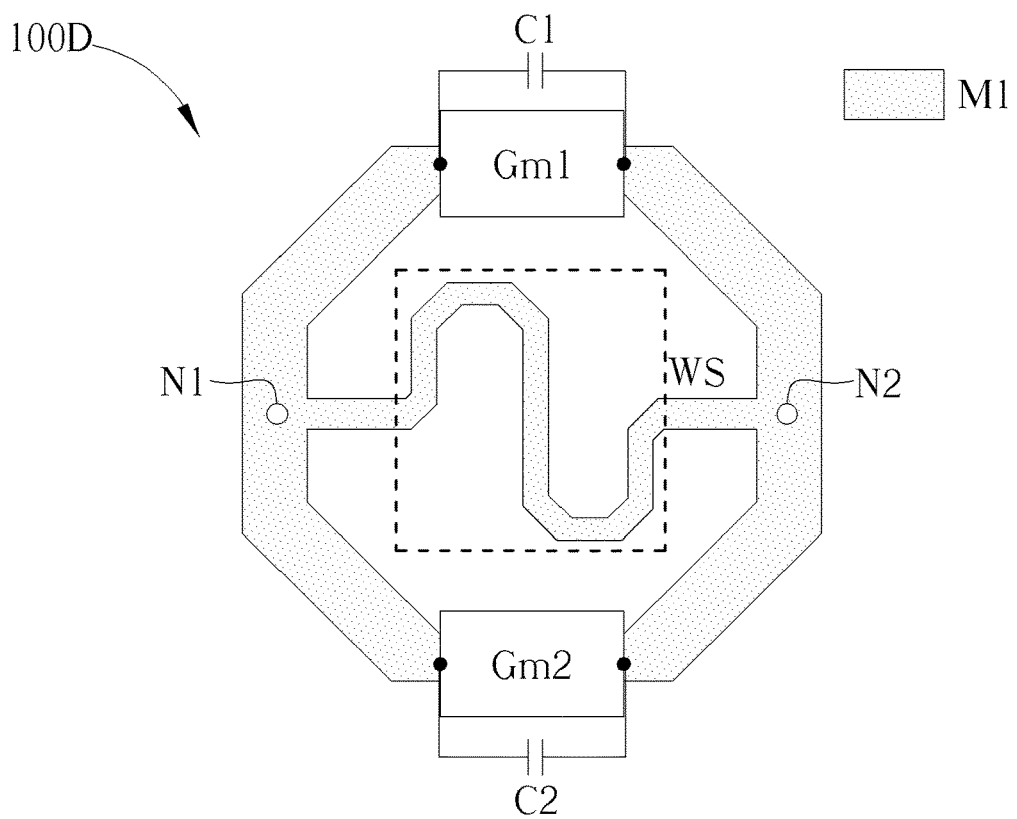
FIG. 1D is a diagram illustrating a one-coil multi-core LC oscillator according to an embodiment of the present invention.

In some embodiment, the resistance of each of the first segment and the second segment of the outer wire (e.g., a resistance of each of the outer wires W11 and W12) does not have to be greater than a resistance of the central wire W2 the central wire. More particularly, the central wire W2 may comprises at least one bended segment. Different architectures of the at least one bended segment will be described in the embodiments of FIG. 1B, FIG. 1C and FIG. 1D. In the embodiments of FIG. 1B, FIG. 1C and FIG. 1D, the implementation of the outer wire, the first core circuit and the second core circuit are similar to that of the embodiment of FIG. 1A, and will not be repeated in detail for brevity.

It should be noted that the transconductance device Gm1 may be identical to the transconductance device Gm2, and the tank capacitor C1 may be identical to the tank capacitor C2. In addition, the tank capacitors C1 and C2 are configured to control an oscillation frequency of the one-coil multi-core LC oscillator 100A. More particularly, the oscillation frequency is determined by a capacitance of each of the tank capacitors C1 and C2 and an equivalent inductance of the one-coil multi-core LC oscillator 100A. Detailed implementations of the first core circuit (e.g., the transconductance device Gm1 and the tank capacitor C1 therein) and the second core circuit (e.g., the transconductance device Gm2 and the tank capacitor C2 therein) should be well-known for those skilled in this art, and are therefore omitted here for brevity.

FIG. 1B is a diagram illustrating a one-coil multi-core LC oscillator 100B according to an embodiment of the present invention. In the embodiment of FIG. 1B, the at least one bended segment may comprise a twisted wire having a first segment W21, an intermediate segment W2C and a second segment W22. In detail, the first segment W21 of the twisted wire is routed from the node N1 of the outer wire W11 to the intermediate segment W2C of the twisted wire in a counterclockwise direction, and the second segment W22 of the twisted wire is routed from the intermediate segment W2C of the twisted wire to the node N2 of the outer wire W12 in a clockwise direction, where the intermediate segment W2C may be implemented on a metal layer M3. In detail, a first end of the first segment W21 is coupled to the node N1, a first end of the intermediate segment W2C is coupled to a second end of the first segment, a first end of the second segment W22 is coupled to a second end of the intermediate segment W2C, and a second end of the second segment W22 is coupled to the node N2. A length of the central wire (e.g., an entirety of the first segment W21, the intermediate segment W2C and the second segment W22) shown in FIG. 1B can be increased in comparison with the central wire W2 shown in the embodiment of FIG. 1A, and therefore an equivalent inductance of the central wire shown in FIG. 1B can be accordingly increased in comparison with that of the central wire W2 shown in FIG. 1A.

FIG. 1C is a diagram illustrating a one-coil multi-core LC oscillator 100C according to an embodiment of the present invention. In the embodiment of FIG. 1C, the at least one bended segment may comprise one or more ringed wires connected in series such as ringed wires WR1 and WR2 connected in series. Each of the ringed wires WR1 and WR2 may be regarded as two inductors connected in parallel, and therefore an equivalent inductance of the central wire which comprises the ringed wires WR1 and WR2 can be reduced in comparison with the central wire W2 shown in the embodiment of FIG. 1A.

FIG. 1D is a diagram illustrating a one-coil multi-core LC oscillator 100D according to an embodiment of the present invention. In the embodiment of FIG. 1D, the at least one bended segment may comprise an S-serpentine wire WS. As shown in FIG. 1D, a length of the central wire (e.g., the S-serpentine wire WS) shown in FIG. 1D can be increased in comparison with the central wire W2 shown in the embodiment of FIG. 1A, and therefore an equivalent inductance of the central wire shown in FIG. 1D can be accordingly increased in comparison with that of the central wire W2 shown in FIG. 1A.

Figure 1E:
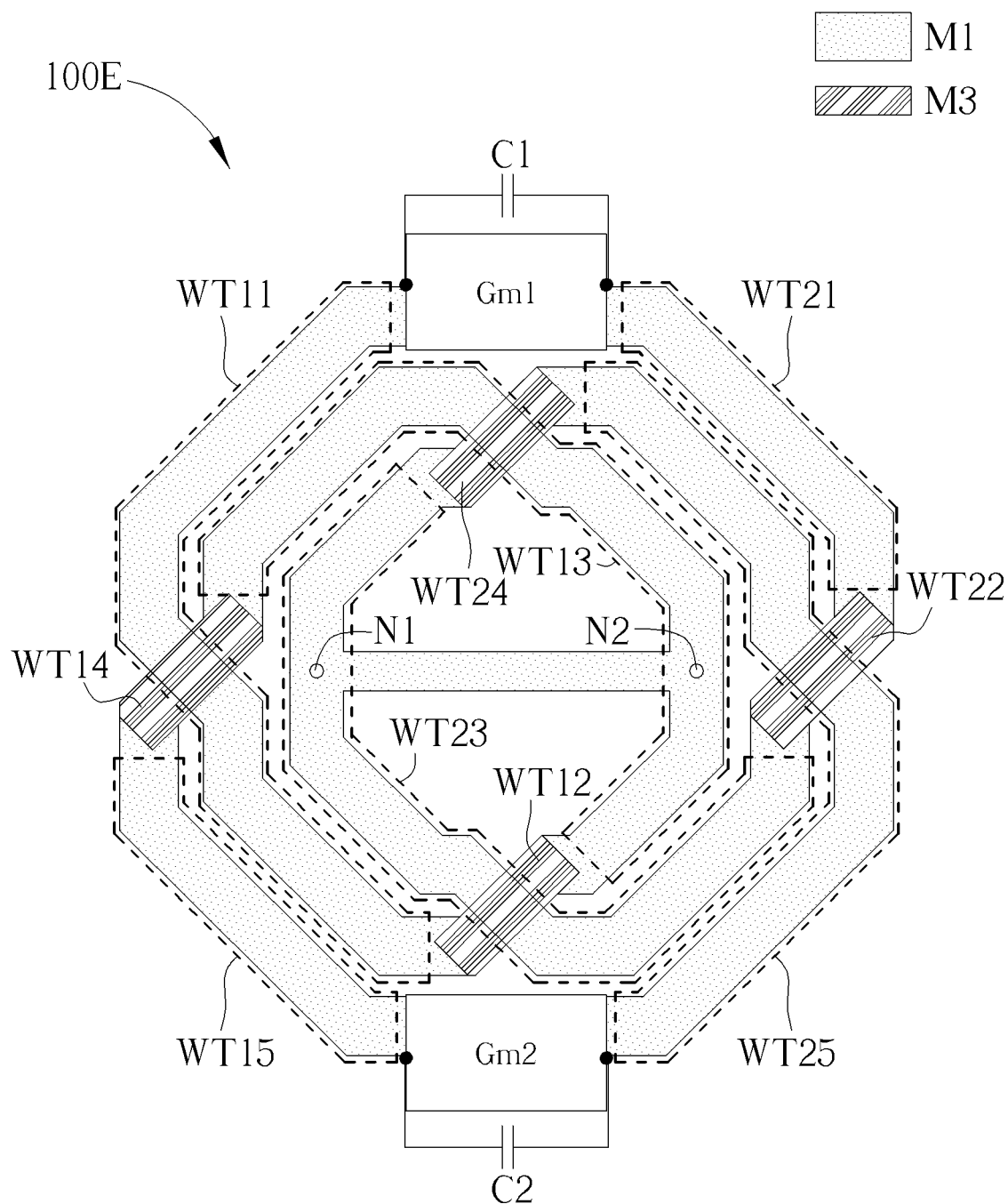
FIG. 1E is a diagram illustrating a one-coil multi-core LC oscillator according to an embodiment of the present invention.

In some embodiment, the outer wire of the one-coil multi-core LC oscillator 100E can be implemented with a multi-turn architecture as shown in FIG. 1E, where FIG. 1E is a diagram illustrating a one-coil multi-core LC oscillator 100E according to an embodiment of the present invention. As shown in FIG. 1E, the outer wire of the one-coil multi-core LC oscillator 100E may comprise a first sub-coil and a second sub-coil. The first sub-coil is coupled between the first terminal of the first core circuit (e.g., the transconductance device Gm1 therein) and the first terminal of the second core circuit (e.g., the transconductance device Gm2 therein). For example, the first sub-coil may comprise segments WT11, WT12, WT13, WT14 and WT15, where a first end of the segment WT11 is coupled to the first terminal of the first core circuit, a first end of the segment WT12 is coupled to a second end of the segment WT11, a first end of the segment WT13 is coupled to a second end of the segment WT12, a first end of the segment WT14 is coupled to a second end of the segment WT13, a first end of the segment WT15 is coupled to a second end of the segment WT14, and a second end of the segment WT15 is coupled to the first terminal of the second core circuit. The second sub-coil is coupled between the second terminal of the first core circuit (e.g., the transconductance device Gm1 therein) and the second terminal of the second core circuit (e.g., the transconductance device Gm2 therein). For example, the second sub-coil may comprise segments WT21, WT22, WT23, WT24 and WT25, where a first end of the segment WT21 is coupled to the second terminal of the first core circuit, a first end of the segment WT22 is coupled to a second end of the segment WT21, a first end of the segment WT23 is coupled to a second end of the segment WT22, a first end of the segment WT24 is coupled to a second end of the segment WT23, a first end of the segment WT25 is coupled to a second end of the segment WT24, and a second end of the segment WT25 is coupled to the second terminal of the second core circuit. In addition, the first sub-coil is concentric with the second sub-coil, which can increase an equivalent inductance of the outer wire in comparison with that of the embodiment of FIG. 1A without greatly increase additional area.

In the embodiment of FIG. 1E, the central wire may be a straight wire coupled between the nodes N1 and N2 of the outer wire, but the present invention is not limited thereto. In some embodiment, an alternative design of the central wire illustrated in any of the embodiments of FIG. 1B, FIG. 1C and FIG. 1D can be adopted in the main coil shown in FIG. 1E.

In the embodiments of FIGS. 1A to 1E, two transconductance devices are utilized to drive the LC load of a one-coil multi-core LC oscillator (e.g., one transconductance device per core circuit), but the present invention is not limited thereto. In some embodiment, any of the one-coil multi-core LC oscillators 100A to 100E may utilize a single transconductance device to drive the whole LC load; for example, one of the transconductance devices Gm1 and Gm2 may be omitted. When the number of transconductance devices is reduced, overall power consumption can be reduced.

For better comprehension, the following embodiment will be described based on the architecture shown in FIG. 1A as an example. In some embodiments, the width of the central wire W2 may be much less than the width of each of the outer wires W11 and W12, which makes the central wire W2 have an impedance much higher than each of the outer wires W11 and W12, and a current on the main coil tend to prevent flowing between the nodes N1 and N2 via the central wire W2. In some embodiment, the central wire W2 does not limited to have an impedance much higher than each of the outer wires W11 and W12, and multiple behaviors or operation modes respectively corresponding to the relative high equivalent inductance and the relative low equivalent inductance are allowed to coexist on the main coil. For example, the impedance (e.g., resistance) of the central wire W2 may be close to that of each of the outer wires W11 and W12. In another example, the impedance (e.g., resistance) of the central wire W2 may be less than that of each of the outer wires W11 and W12.

In addition to the main coil, the first core circuit and the second core circuit, the one-coil multi-core LC oscillator 100A may further comprise at least one suppression device. In detail, an outer loop formed by the outer wire may correspond to a first mode (e.g., a high band mode corresponding to the relative low equivalent inductance) of the one-coil multi-core LC oscillator 100A, and inner loops formed by the outer wire and the central wire may correspond to a second mode (e.g., a low band mode corresponding to the relative high equivalent inductance) of the one-coil multi-core LC oscillator 100A. More particularly, the at least one mode suppression device may be configured to suppress one of the first mode and the second mode, and thereby increase a quality factor of another one of the first mode and the second mode. In embodiments of FIG. 2A, FIG. 2B and FIG. 2C, the at least one mode suppression device may be configured to suppress the low band mode, in order to increase a quality factor of the high band mode. In embodiments of FIG. 3A, FIG. 3B and FIG. 3C, the at least one mode suppression device may be configured to suppress the high band mode, in order to increase a quality factor of the low band mode.

Figure 2A:
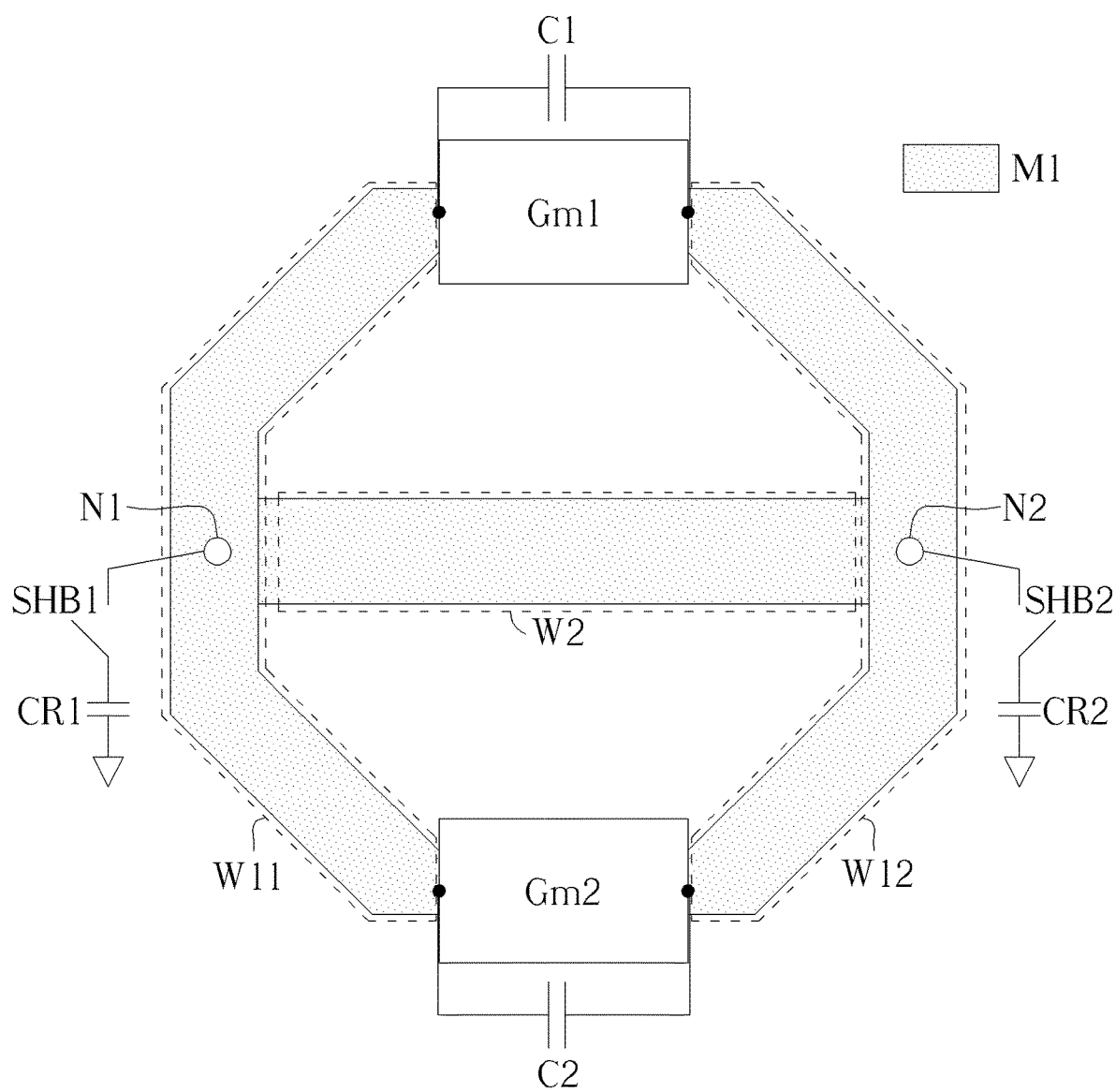
FIG. 2A is a diagram illustrating a one-coil multi-core LC oscillator with resonance capacitors according to an embodiment of the present invention.

In the embodiment of FIG. 2A, the at least one mode suppression device may comprise resonance capacitors CR1 and CR2, and may be configured to be coupled to the central wire for suppressing the low band mode when switches SHB1 and SHB2 are turned on, in order to make the one-coil multi-core LC oscillator 100A operates in the high band mode (e.g., to increase the quality factor of the high band mode). In some embodiment, each of the resonance capacitors CR1 and CR2 may be a switchable capacitor circuit which provides a switchable capacitance, to allow the one-coil multi-core LC oscillator 100A to be adopted in wide-band applications. It should be noted that positions (e.g., nodes) of the main coil for coupling the resonance capacitors CR1 and CR2 shown in FIG. 2A are for illustrative purposes only, and are not meant to be a limitation of the present invention. For example, the resonance capacitors CR1 and CR2 may be coupled to any nodes on the central wire W2 symmetrically.

Figure 2B:
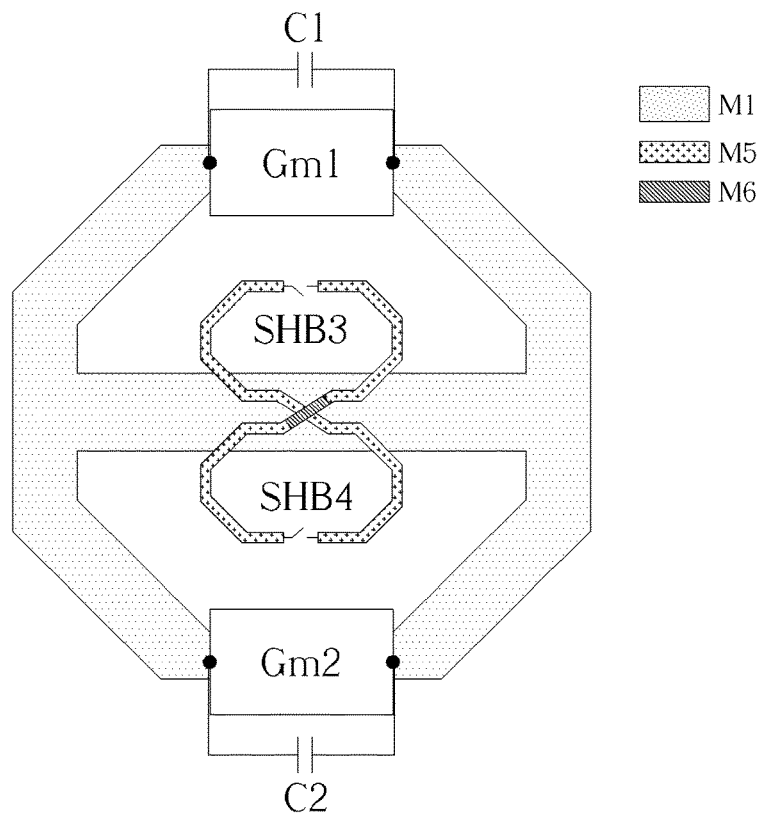
FIG. 2B is a diagram illustrating a one-coil multi-core LC oscillator with a twisted mutual coil according to an embodiment of the present invention.

In the embodiment of FIG. 2B, the at least one mode suppression device may comprise a twisted mutual coil which is illustrated by metal layers M5 and M6. The twisted mutual coil may be configured to form a close loop for suppressing the low band mode when switches SHB3 and SHB4 are turned on, in order to make the one-coil multi-core LC oscillator 100A operate in the high band mode (e.g., to increase the quality factor of the high band mode). In detail, a first segment of the twisted mutual coil (e.g., an upper half of the twisted mutual coil) and a second segment of the twisted mutual coil (e.g., an lower half of the twisted mutual coil) are placed to be concentric with the main coil (which can be above, below, or nearby the main coil). In this embodiment, each of the switches SHB3 and SHB4 may be connected in series with the metal layer M5 on the close loop of the twisted coil, but the present invention is not limited thereto.

Figure 2C:
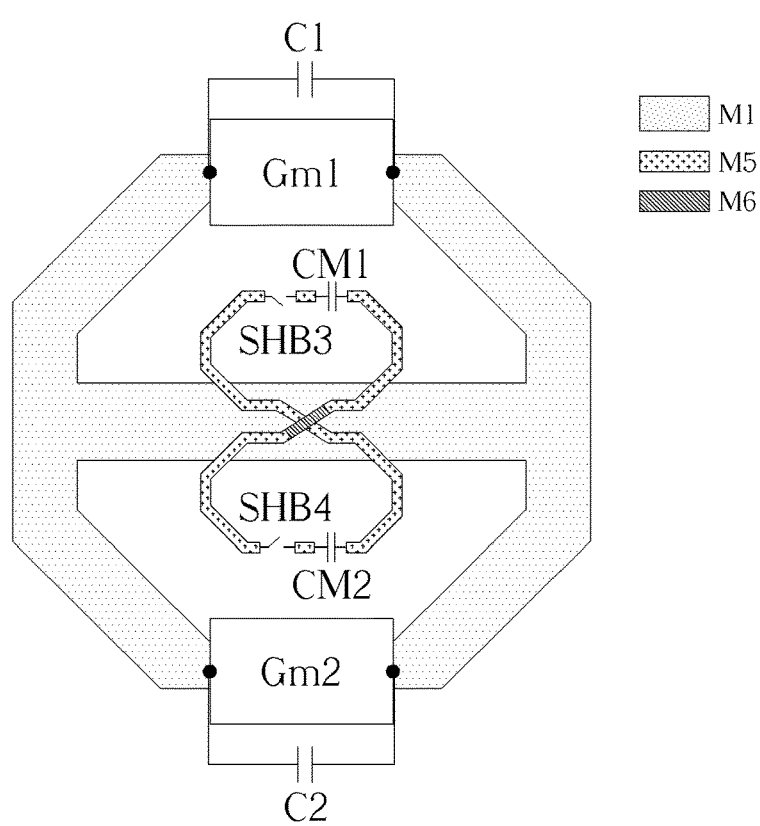
FIG. 2C is a diagram illustrating a one-coil multi-core LC oscillator with a twisted mutual coil and mutual capacitors according to an embodiment of the present invention.

In addition, the at least one mode suppression device may further comprise at least one capacitor such as mutual capacitors CM1 and CM2 as shown in FIG. 2C, where the mutual capacitors CM1 and CM2 may be connected in series with the twisted mutual coil. The mutual capacitors CM1 and CM2 can be configured to introduce a maximum loss for the low band mode regarding a specific frequency (e.g., the oscillation frequency). Based on the frequency selectivity introduced by the mutual capacitors CM1 and CM2, the embodiment of FIG. 2C can further improve the quality factor of the high band mode in comparison with the embodiment of FIG. 2B. In some embodiment, each of the mutual capacitors CM1 and CM2 may be a switchable capacitor circuit which provides a switchable capacitance, to make the frequency selectivity introduced by the mutual capacitors CM1 and CM2 be applied to wide-band applications.

Figure 3A:
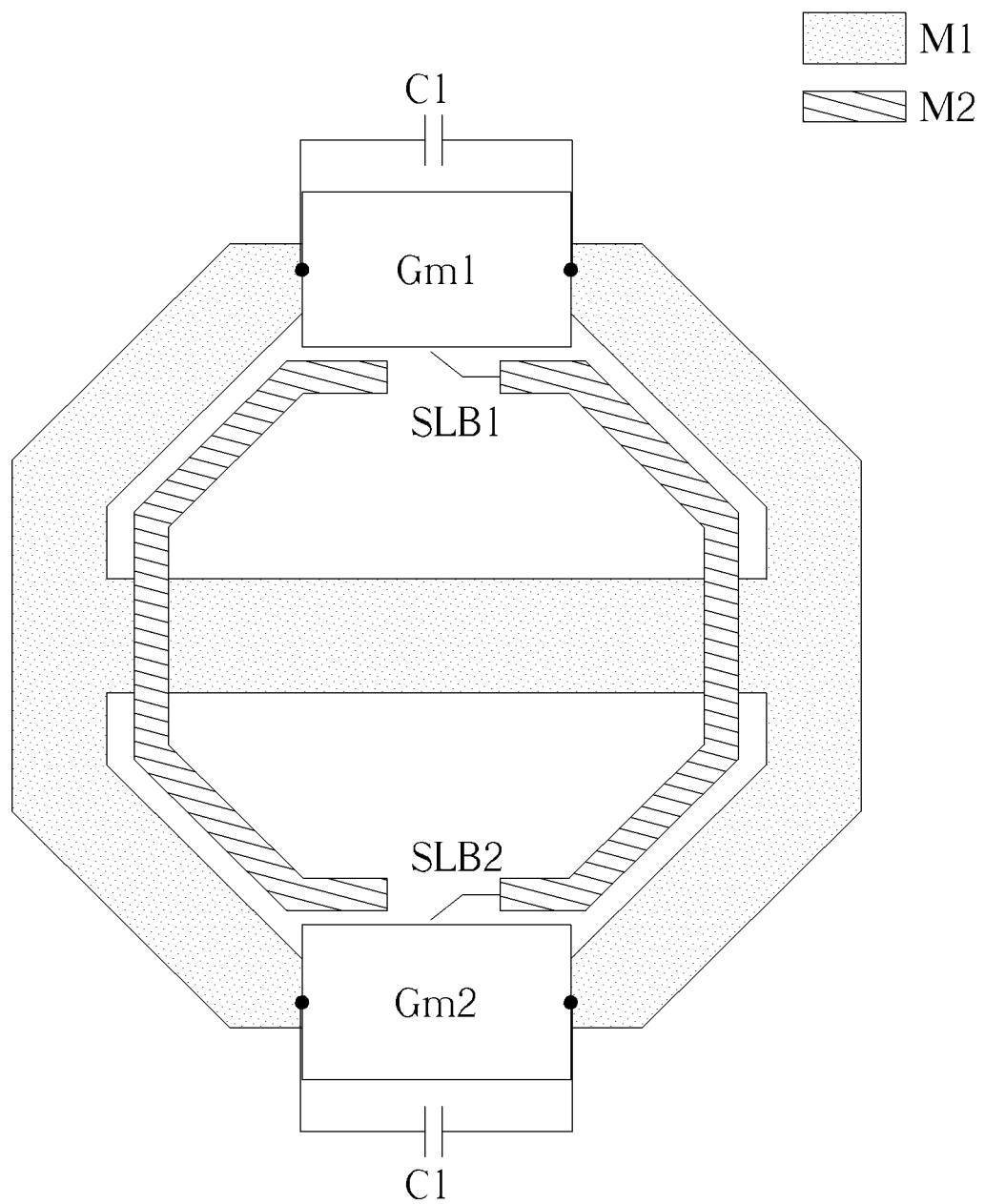
FIG. 3A is a diagram illustrating a one-coil multi-core LC oscillator with a mutual coil according to an embodiment of the present invention.

In the embodiment of FIG. 3A, the at least one mode suppression device may comprise a mutual coil which is illustrated by a metal layer M2, where the mutual coil may be placed along the outer wires W11 and W12 (which can be above, below, or nearby the outer wire). For example, the mutual coil is placed to be concentric with the main coil. The mutual coil may be configured to form a close loop for suppressing the high band mode, in order to make the one-coil multi-core LC oscillator 100A operate in the low band mode (e.g., to increase the quality factor of the low band mode).

Figure 3B:
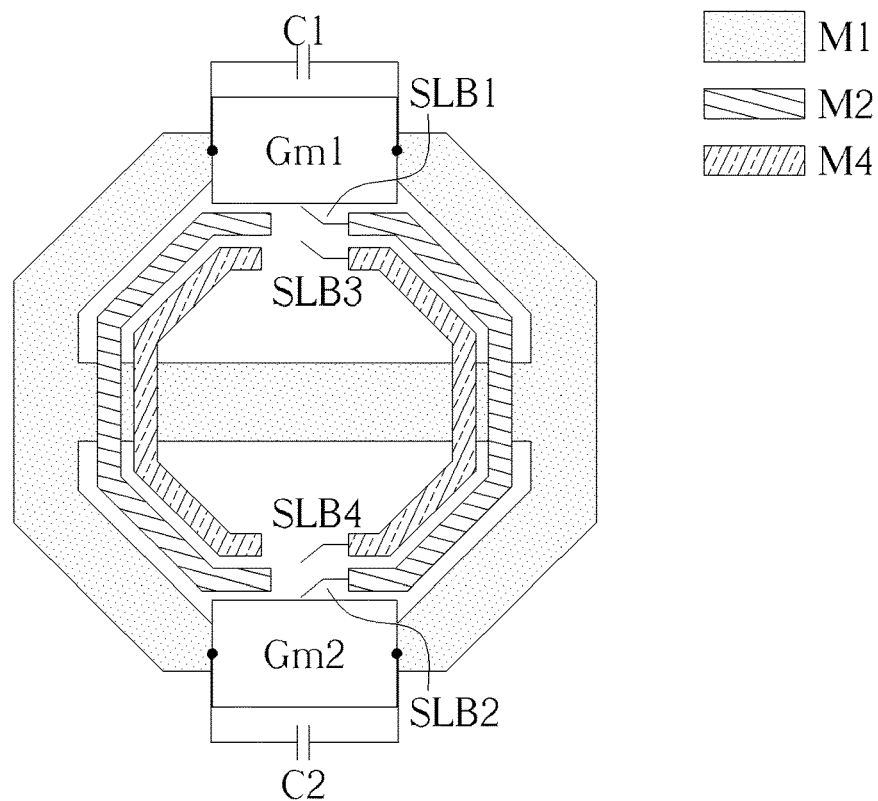
FIG. 3B is a diagram illustrating a one-coil multi-core LC oscillator with multiple mutual coils according to an embodiment of the present invention.

In the embodiment of FIG. 3B, the at least one mode suppression device may comprise multiple mutual coil such as a first mutual coil illustrated by the metal layer M2 and a second mutual coil illustrated by a metal layer M4, where each of the first mutual coil and the second mutual coil may be placed along the outer wires W11 and W12 (which can be above, below, or nearby the outer wire). In particular, each of the first mutual coil and the second mutual coil may be an example of the mutual coil shown in FIG. 3A. In comparison with utilizing a single mutual coil as shown in FIG. 3A, utilizing multiple mutual coil as shown in FIG. 3B can further enhance the suppression of the high band mode, to thereby improve the quality factor of the low band mode.

Figure 3C:
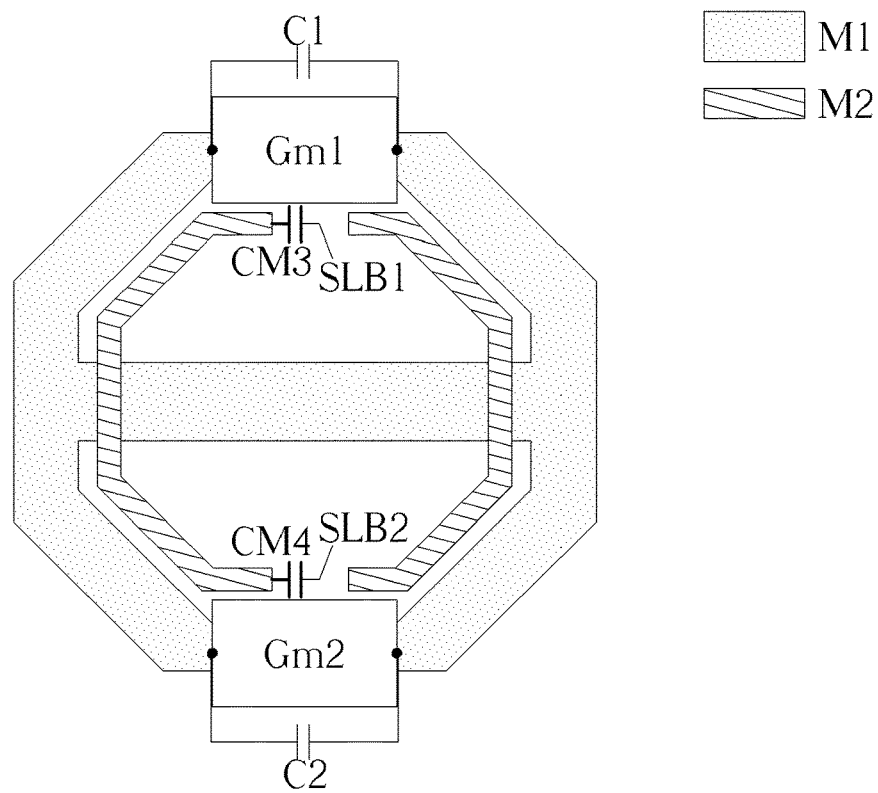
FIG. 3C is a diagram illustrating a one-coil multi-core LC oscillator with a mutual coil and mutual capacitors according to an embodiment of the present invention.

In the embodiment of FIG. 3C, the at least one mode suppression device may comprise at least one capacitor such as mutual capacitors CM3 and CM4, where each of the mutual capacitors CM3 and CM4 is connected in series with the mutual coil as shown in FIG. 3C. Similar to the mutual capacitor CM1 and CM2 shown in FIG. 2C, the mutual capacitors CM3 and CM4 introduce the frequency selectivity, which makes the loss of the high band mode be maximized at a specific frequency (e.g., the oscillation frequency). In some embodiment, each of the mutual capacitors CM3 and CM4 may be a switchable capacitor circuit which provides a switchable capacitance, to make the frequency selectivity introduced by the mutual capacitors CM3 and CM4 be applied to wide-band applications.

Different implementations of the at least one mode suppression device mentioned in the above embodiments are illustrated on the basis of the architecture of FIG. 1A, but the present invention is not limited thereto. These implementations of the at least one mode suppression device can be applied to the architecture of any of FIG. 1B, FIG. 1C, FIG. 1D and FIG. 1E.

It should be noted that multiple mode suppression devices mentioned in the previous embodiments may be included in a one-coil multi-core LC oscillator for different purposes. In some embodiment, two or more mode suppression devices provided by the embodiment of FIGS. 2A to 2C may be included in a one-coil multi-core LC oscillator, which can enhance the ability of suppressing the low band mode in comparison with merely utilizing one mode suppression device, and therefore the quality factor of the high band mode is able to be further increased. In some embodiment, two or more mode suppression devices provided by the embodiment of FIGS. 3A to 3C may be included in a one-coil multi-core LC oscillator, which can enhance the ability of suppressing the high band mode in comparison with merely utilizing one mode suppression device, and therefore the quality factor of the low band mode is able to be further increased. In some embodiment, at least one mode suppression device provided by the embodiment of FIGS. 2A to 2C and at least one mode suppression device provided by the embodiment of FIGS. 3A to 3C may be included in a mode suppression device, to make the one-coil multi-core LC oscillator be able to selectively operate in the high band mode and the low band mode.

Figure 4:
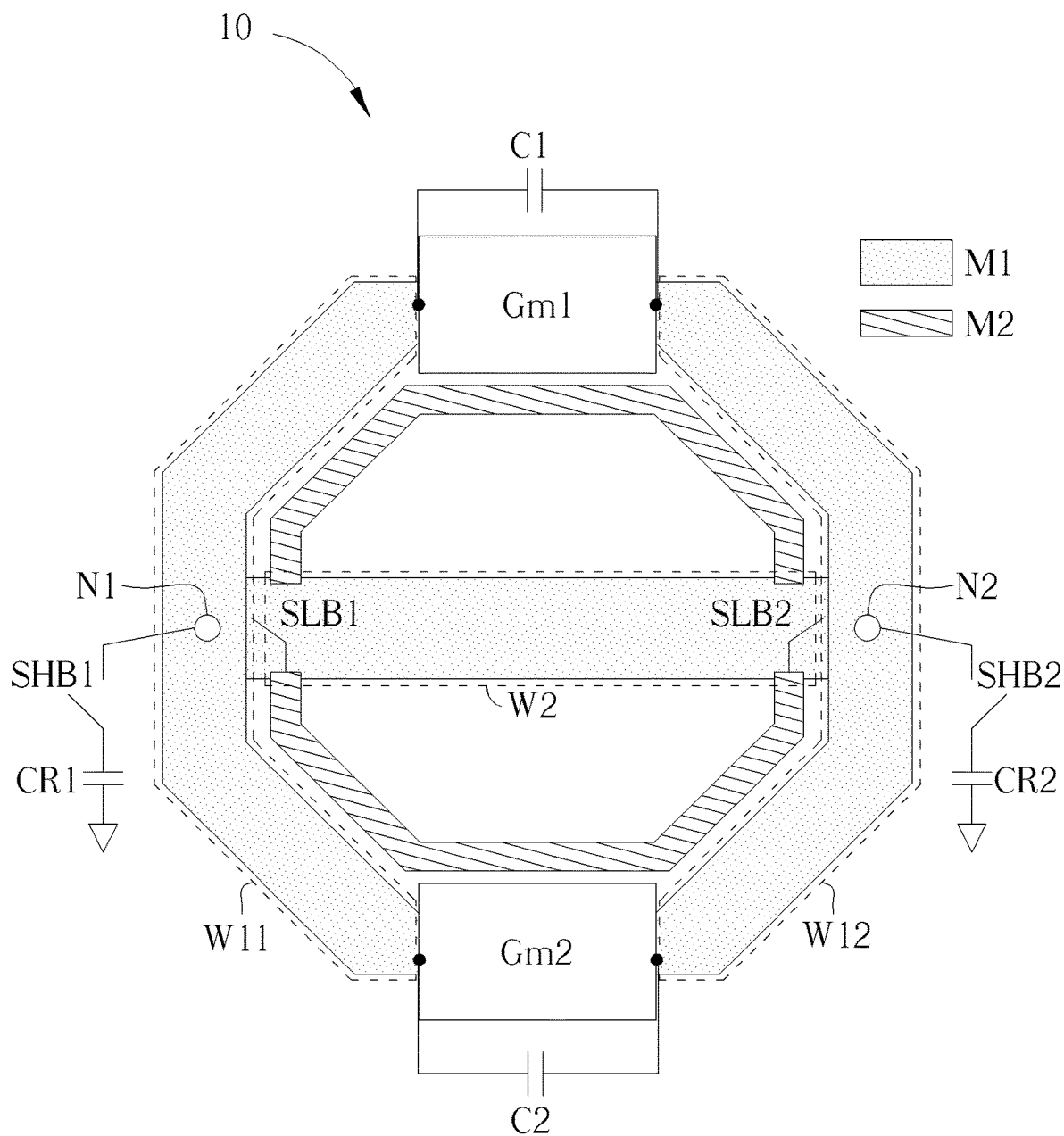
FIG. 4 is a diagram illustrating a one-coil dual-core LC oscillator according to an embodiment of the present invention.

FIG. 4 is a diagram illustrating a one-coil dual-core LC oscillator 10 according to an embodiment of the present invention, where the one-coil dual-core LC oscillator 10 may be an example of superposition of the embodiments of FIG. 2A and FIG. 3A. In this embodiment, the resonance capacitors CR1 and CR2 are controlled by a first set of switches which may comprise the switches SHB1 and SHB2, and the mutual coil is controlled by a second set of switches (which may comprise the switches SLB1 and SLB2). As mentioned in the previous embodiment, according to the design related to the dimension or impedance of the main coil, multiple behaviors or operation modes respectively corresponding to the relative high equivalent inductance and the relative low equivalent inductance may coexist on the main coil. In particular, the one-coil dual-core LC oscillator 10 may suppress unwanted behavior or mode on the main coil by selectively enabling the resonance capacitors CR1 and CR2 or the mutual coil in response to conditions of the one-coil dual-core LC oscillator 10 being set to operate in a first mode (e.g., a high band mode corresponding to the relative low equivalent inductance such as LHB) or a second mode (e.g., a low band mode corresponding to the relative high equivalent inductance such as LLB), in order to prevent a quality factor of the equivalent inductor for both the first mode and the second mode from being degraded due to mode coexistence.

Figure 5:
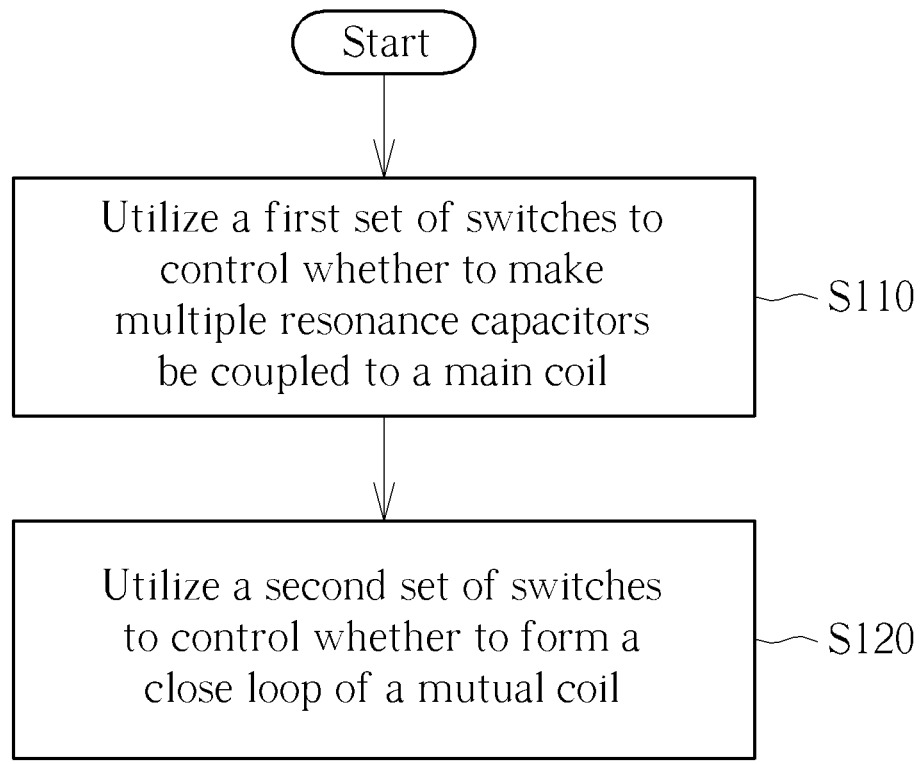
FIG. 5 is a diagram illustrating a working flow of a method for controlling operation modes of a multi-core LC oscillator according to an embodiment of the present invention.

FIG. 5 is a diagram illustrating a working flow of a method for controlling operation modes of a multi-core LC oscillator (e.g., the one-coil dual-core LC oscillator 10 shown in FIG. 4) according to an embodiment of the present invention. It should be noted that the working flow shown in FIG. 5 is for illustrative purposes only, and is not meant to be a limitation of the present invention. In some embodiments, one or more steps may be added, deleted or modified in the working flow shown in FIG. 5. In addition, if a same result may be obtained, these steps do not have to be executed in the exact order shown in FIG. 5.

In Step S110, the multi-core LC oscillator (e.g., the one-coil dual-core LC oscillator 10) may utilize a first set of switches (e.g., the switches SHB1 and SHB2) to control whether to make multiple resonance capacitors (e.g., the resonance capacitors CR1 and CR2) be coupled to a main coil (e.g., the portion illustrated by the metal layer M1 shown in FIG. 4). As shown in FIG. 4, the switch SHB1 is coupled between the node N1 and the resonance capacitor CR1, and the switch SHB2 is coupled between the node N2 and the resonance capacitor CR2.

In Step S120, the multi-core LC oscillator (e.g., the one-coil dual-core LC oscillator 10) may utilize a second set of switches (e.g., the switches SLB1 and SLB2) to control whether to generate a close loop of a mutual coil (e.g., the portion illustrated by the metal layer M2 shown in FIG. 4). As shown in FIG. 4, each of the switches SLB1 and SLB2 is connected in series with the metal layer M2 on the close loop of the mutual coil.

In detail, when the one-coil dual-core LC oscillator 10 is set to operate in the first mode (e.g., the high band mode), the first set of switches (e.g., the switches SHB1 and SHB2) are turned on to make the resonance capacitors CR1 and CR2 be coupled to the main coil (e.g., be coupled to the nodes N1 and N2, respectively), and the second set of switches (e.g., the switches SLB1, and SLB2) are turned off to prevent generating the close loop of the mutual coil. When the one-coil dual-core LC oscillator 10 is set to operate in the second mode (e.g., the low band mode), the first set of switches (e.g., the switches SHB1 and SHB2) are turned off to prevent the resonance capacitors CR1 and CR2 from being coupled to the main coil, and the second set of switches (e.g., the switches SLB1 and SLB2) are turned on to generate the close loop of the mutual coil. It should be noted that the control of the first set of switches and the second set of switches mentioned above is for illustrative purposes only, and is not meant to be a limitation of the present invention. For example, the first set of switches do not have to be turned off when the second set of switches are turned on, and the second set of switches do not have to be turned off when the first set of switches are turned on. In some embodiment, the first set of switches and the second set of switches may be turned on together or turned off together.

Figure 6A:
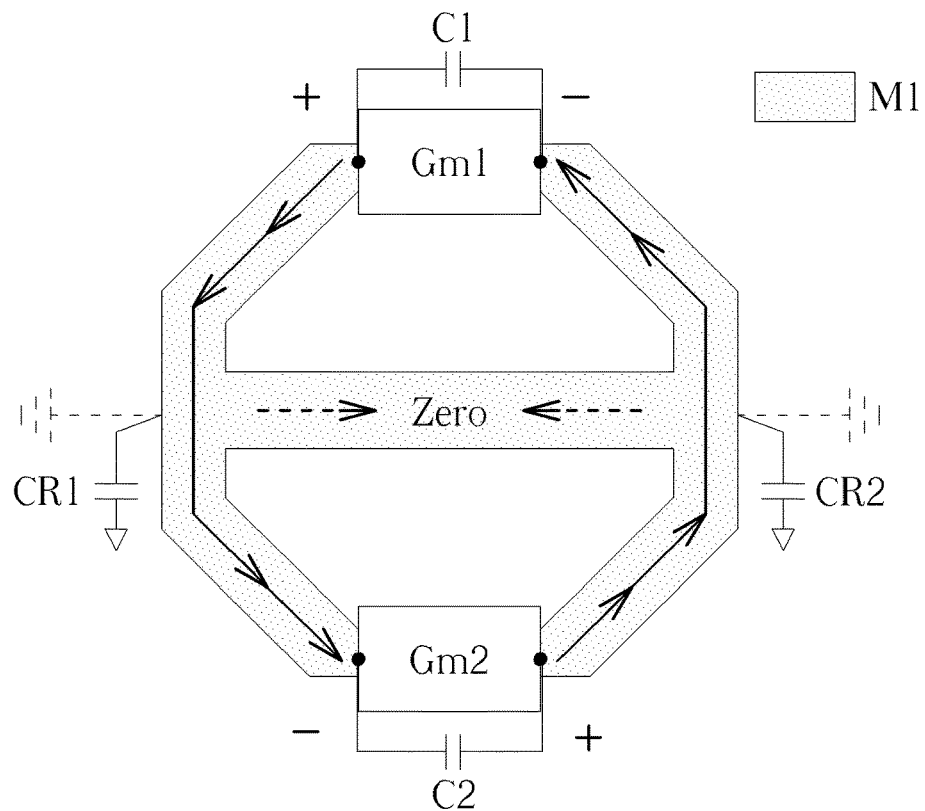
FIG. 6A is a diagram illustrating an operation mode of the one-coil dual-core LC oscillator shown in FIG. 4 being set to operate in a high band mode according to an embodiment of the present invention.

FIG. 6A is a diagram illustrating an operation mode (e.g., the behavior or mode that is wanted and needs to be kept) of the one-coil dual-core LC oscillator 10 being set to operate in the high band mode according to an embodiment of the present invention. As the second set of switches (e.g., the switches SLB1, and SLB2) are turned off to prevent generating the close loop of the mutual coil when the one-coil dual-core LC oscillator 10 is set to operate in the high band mode, the mutual coil may be regarded as being disabled, and is therefore omitted in FIG. 6A for brevity. As shown in FIG. 6A, a first terminal of the first core circuit (e.g. a left terminal of the transconductance device Gm1 and the tank capacitor C1 therein shown in figures) acts as a positive electrode (which is labeled "+" for better comprehension), and a second terminal of the first core circuit (e.g. a right terminal of the transconductance device Gm1 and the tank capacitor C1 therein shown in figures) acts as a negative electrode (which is labeled "—" for better comprehension). In addition, a first terminal of the second core circuit (e.g. a left terminal of the transconductance device Gm2 and the tank capacitor C2 therein shown in figures) acts as a negative electrode (which is labeled "—" for better comprehension), and a second terminal of the second core circuit (e.g. a right terminal of the transconductance device Gm2 and the tank capacitor C2 therein shown in figures) acts as a positive electrode (which is labeled "+" for better comprehension). This is, W11 or W12 are excited with an out of phase signal. Thus, the nodes N1 and N2 may act as virtual short, and there is no current flowing between the nodes N1 and N2 via the central wire W2 (which is labeled "Zero" for better comprehension). In addition, as the nodes N1 and N2 act as virtual short, the resonance capacitors CR1 and CR2 respectively coupled to the nodes N1 and N2 does not hinder operations of the operation mode of the one-coil dual-core LC oscillator 10 being set to operate in the high band mode.

Figure 6B:
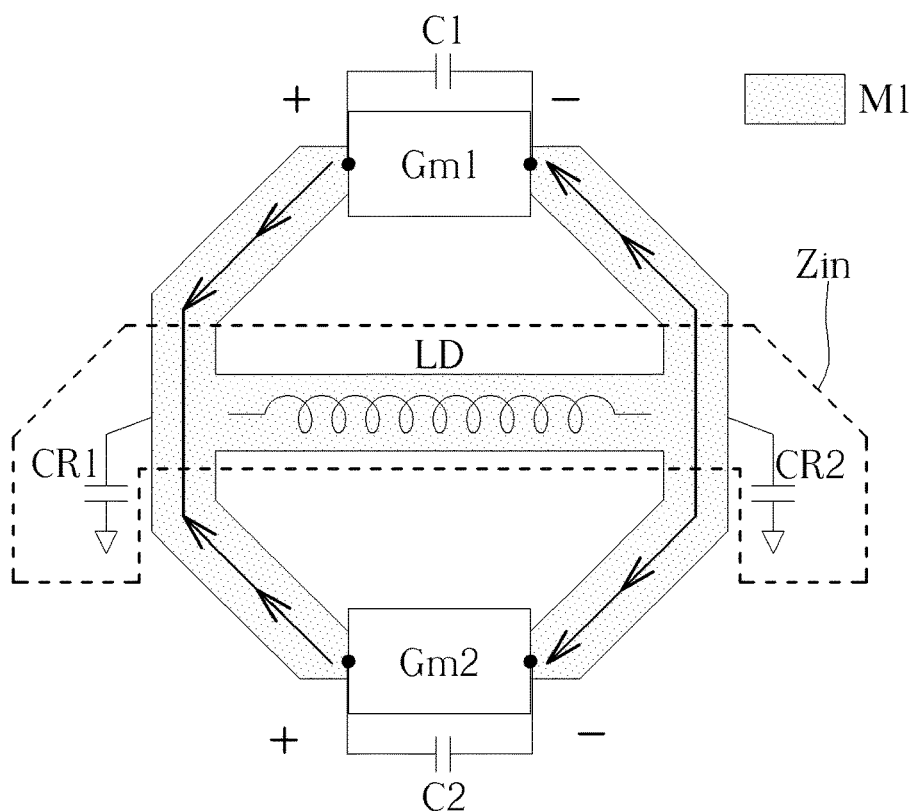
FIG. 6B is a diagram illustrating a forbidden mode of the one-coil dual-core LC oscillator shown in FIG. 4 being set to operate in a high band mode according to an embodiment of the present invention.

FIG. 6B is a diagram illustrating a forbidden mode (e.g., the behavior or mode that is unwanted and needs to be suppressed) of the one-coil dual-core LC oscillator 10 to be set to operate in the high band mode according to an embodiment of the present invention. As the second set of switches (e.g., the switches SLB1, and SLB2) are turned off to prevent generating the close loop of the mutual coil when the one-coil dual-core LC oscillator 10 is set to operate in the high band mode, the mutual coil may be regarded as being disabled, and is therefore omitted in FIG. 6B for brevity. As shown in FIG. 6B, the first terminal of the first core circuit acts as a positive electrode (which is labeled "+" for better comprehension), and the second terminal of the first core circuit acts as a negative electrode (which is labeled "—" for better comprehension). In addition, the first terminal of the second core circuit acts as a positive electrode (which is labeled "+" for better comprehension), and the second terminal of the second core circuit acts as a negative electrode (which is labeled "—" for better comprehension). As the nodes N1 and N2 are not virtual short under the forbidden mode of the one-coil dual-core LC oscillator 10 being set to operate in the high band mode, a current may flow from the node N1 to the node N2 via the central wire W2 if the resonance capacitors CR1 and CR2 are disabled. In this embodiment, the central wire W2 may comprise a central inductor LD coupled between the nodes N1 and the node N2, and as the resonance capacitors CR1 and CR2 are coupled to the nodes N1 and N2 when the one-coil dual-core LC oscillator 10 is set to operate in the high band mode, a network Zin comprising the resonance capacitors CR1 and CR2 and the central inductor LD may make the path of the central wire between the nodes N1 and N2 have an impedance much higher than the outer wires W11 and W12, and thereby suppress the current on the central wire W2. Thus, operations of the forbidden mode of the one-coil dual-core LC oscillator 10 being set to operate in the high band mode can be suppressed.

Figure 6C:
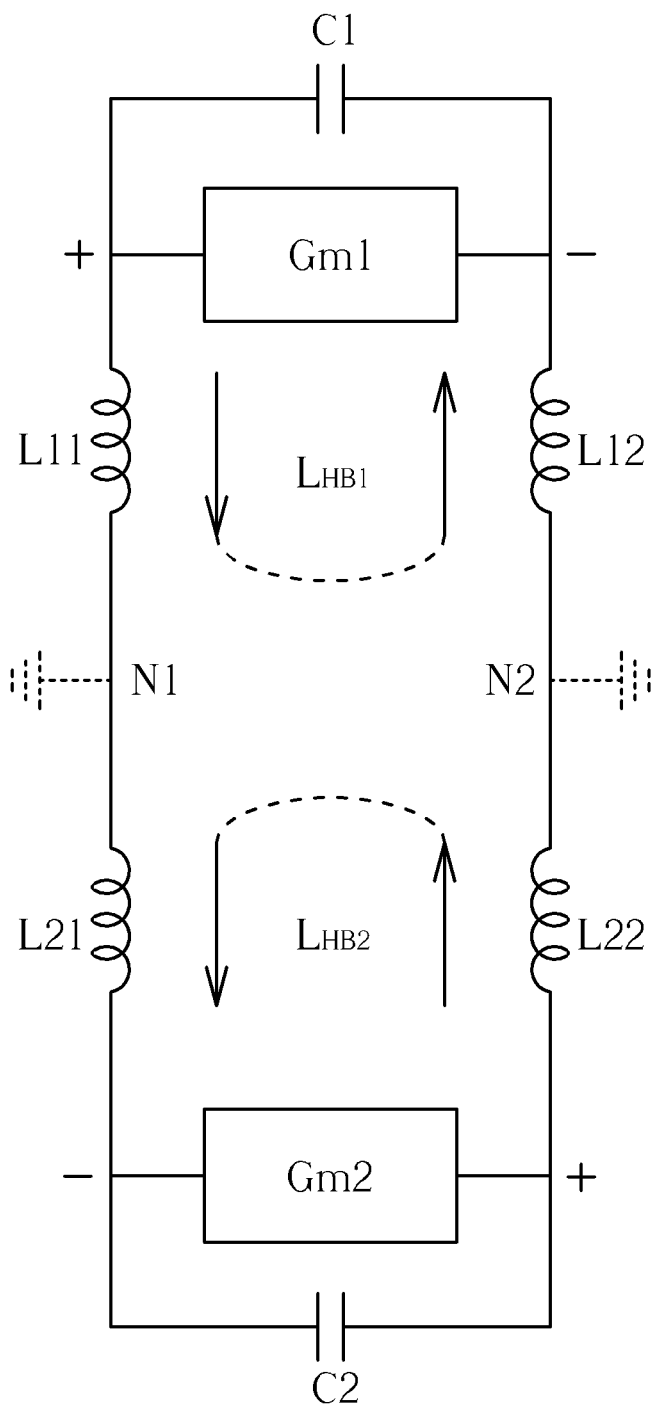
FIG. 6C is a diagram illustrating an equivalent circuit of the one-coil dual-core LC oscillator shown in FIG. 4 being set to operate in a high band mode according to an embodiment of the present invention.

FIG. 6C is a diagram illustrating an equivalent circuit of the one-coil dual-core LC oscillator 10 being set to operate in the high band mode according to an embodiment of the present invention. At the high band operation mode, the nodes N1 and N2 may be regarded as virtual short as shown in FIG. 6A. More particularly, the one-coil dual-core LC oscillator 10 operating in the high band mode may be regarded as two one-coil one core LC oscillators connected in parallel as shown in FIG. 6C. For a first one-coil one core LC oscillator of the two one-coil one core LC oscillators that is illustrated by the upper-half of FIG. 6C, an upper segment of the outer wire W11 that is coupled between the node N1 and the first core circuit shown in FIG. 4 may be regarded as an inductor L11, an upper segment of the outer wire W12 that is coupled between the node N2 and the first core circuit shown in FIG. 4 may be regarded as an inductor L12, where an inductance for the first one-coil one core LC oscillator (e.g., an inductance of an entirety of the inductors L11 and L12) may be $L_{HB1}$. For a second one-coil one core LC oscillator of the two one-coil one core LC oscillators that is illustrated by the lower-half of FIG. 6C, a lower segment of the outer wire W11 that is coupled between the node N1 and the second core circuit shown in FIG. 4 may be regarded as an inductor L21, a lower segment of the outer wire W12 that is coupled between the node N2 and the second core circuit shown in FIG. 4 may be regarded as an inductor L22, where an inductance for the second one-coil one core LC oscillator (e.g., an inductance of an entirety of the inductors L21 and L22) may be $L_{HB2}$. Assuming that an inductance of an entirety of the outer wires W11 and W12 is L, each of the inductances $L_{HB1}$ and $L_{HB2}$ may be (L/2), and an equivalent inductance LHB for the one-coil dual-core LC oscillator 10 operating in the high band mode may be (L/4).

Figure 7A:
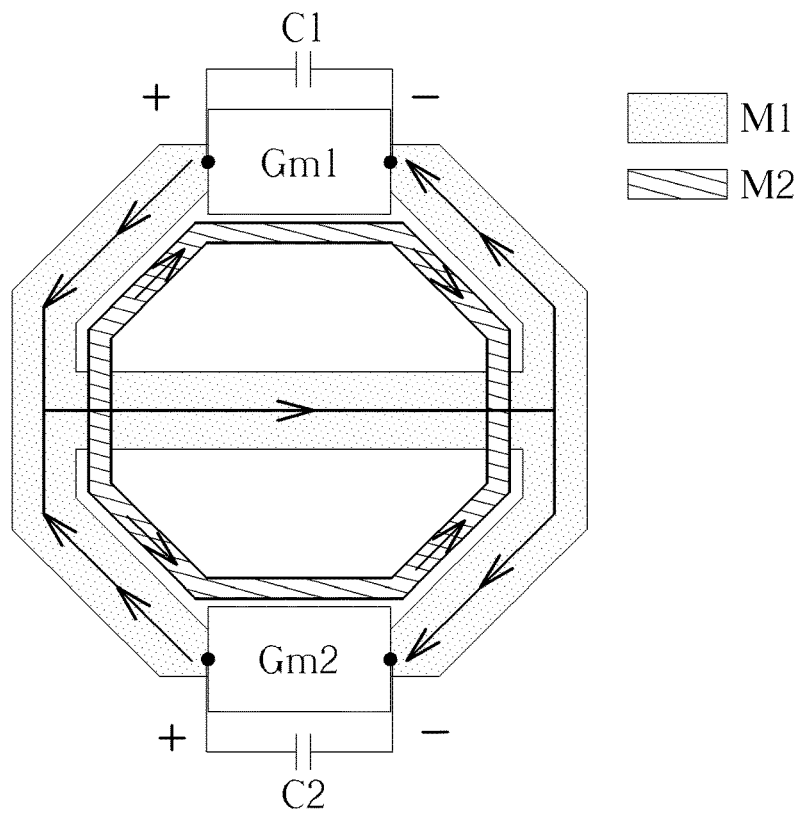
FIG. 7A is a diagram illustrating an operation mode of the one-coil dual-core LC oscillator shown in FIG. 4 being set to operate in a low band mode according to an embodiment of the present invention.

FIG. 7A is a diagram illustrating an operation mode (e.g., the behavior or mode that is wanted and needs to be kept) of the one-coil dual-core LC oscillator 10 being set to operate in the low band mode according to an embodiment of the present invention. As the first set of switches (e.g., the switches SHB1, and SHB2) are turned off to prevent the resonance capacitors CR1 and CR2 from being coupled to the main coil when the one-coil dual-core LC oscillator 10 is set to operate in the low band mode, the resonance capacitors CR1 and CR2 may be regarded as being disabled, and are therefore omitted in FIG. 7A for brevity. As shown in FIG. 7A, the first terminal of the first core circuit (e.g. a left terminal thereof shown in figures) acts as a positive electrode (which is labeled "+" for better comprehension), and the second terminal of the first core circuit acts as a negative electrode (which is labeled "—" for better comprehension). In addition, the first terminal of the second core circuit (e.g. a left terminal thereof shown in figures) acts as a positive electrode (which is labeled "+" for better comprehension), and the second terminal of the second core circuit acts as a negative electrode (which is labeled "—" for better comprehension). This is, W11 or W12 are excited with an in phase signal. Thus, currents respectively from the positive electrodes of the first core circuit and the second core circuit may flow from the node N1 to the node N2 via the central wire W2. It should be noted that a magnetic field introduced by an upper-half current loop (e.g., the current flowing through the positive electrode of the first core circuit, the node N1, the central wire W2, the node N2 and the negative electrode of the first core circuit) and a magnetic field introduced by a lower-half current loop (e.g., the current flowing through the positive electrode of the second core circuit, the node N1, the central wire W2, the node N2 and the negative electrode of the second core circuit) have opposite directions, and induced currents generated on the mutual coil in response to the upper-half current loop and the lower-half current loop may be canceled by each other. Thus, operations of the operation mode of the one-coil dual-core LC oscillator 10 being set to operate in the low band mode will not be hindered by the mutual coil.

Figure 7B:
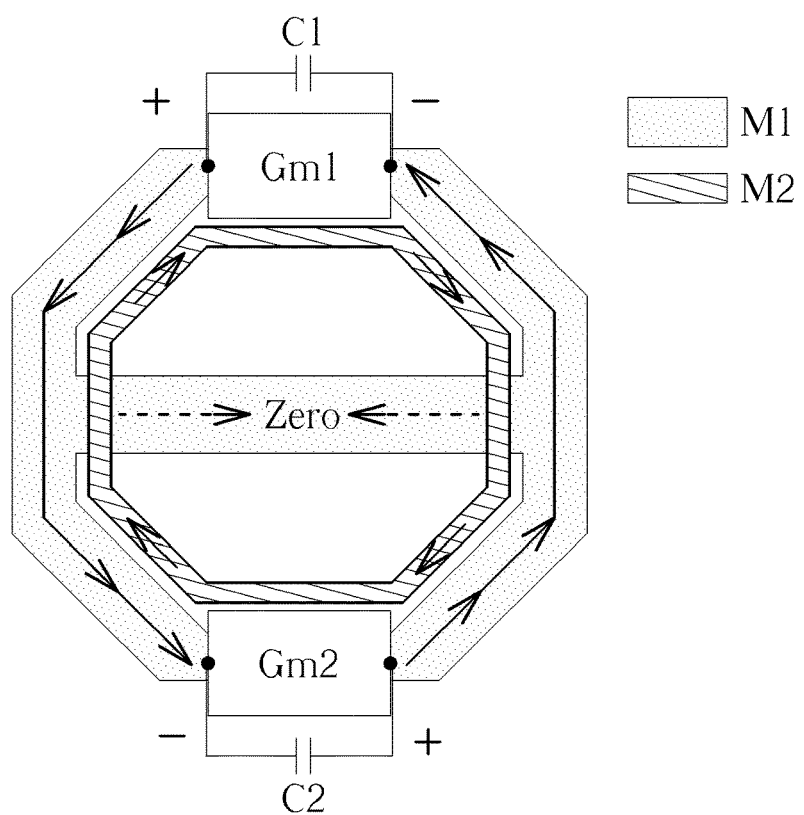
FIG. 7B is a diagram illustrating a forbidden mode of the one-coil dual-core LC oscillator shown in FIG. 4 being set to operate in a low band mode according to an embodiment of the present invention.

FIG. 7B is a diagram illustrating a forbidden mode (e.g., the behavior or mode that is unwanted and needs to be suppressed) of the one-coil dual-core LC oscillator 10 to be set to operate in the low band mode according to an embodiment of the present invention. As the first set of switches (e.g., the switches SHB1, and SHB2) are turned off to prevent the resonance capacitors CR1 and CR2 from being coupled to the main coil when the one-coil dual-core LC oscillator 10 is set to operate in the low band mode, the resonance capacitors CR1 and CR2 may be regarded as being disabled, and are therefore omitted in FIG. 7B for brevity. As shown in FIG. 7B, the first terminal of the first core circuit acts as a positive electrode (which is labeled "+" for better comprehension), and the second terminal of the first core circuit acts as a negative electrode (which is labeled "−" for better comprehension). In addition, the first terminal of the second core circuit acts as a negative electrode (which is labeled "−" for better comprehension), and the second terminal of the second core circuit acts as a positive electrode (which is labeled "+" for better comprehension). Thus, the nodes N1 and N2 may act as virtual short, and there is no current flowing between the nodes N1 and N2 via the central wire W2 (which is labeled "Zero" for better comprehension). In addition, a current flowing from the positive electrode of the first core circuit to the negative electrode of the second core circuit and a current flowing from the positive electrode of the second core circuit to the negative electrode of the first core circuit may form an outer current loop on the outer wires W11 and W12. An induced current may be generated on the mutual coil in response to the outer current loop based on Lenz's law, and thereby suppresses the current of the outer current loop (e.g., the current flowing from the positive electrode of the first core circuit to the negative electrode of the second core circuit or the current flowing from the positive electrode of the second core circuit to the negative electrode of the first core circuit). Thus, operations of the forbidden mode of the one-coil dual-core LC oscillator 10 being set to operate in the low band mode can be suppressed.

Figure 7C:
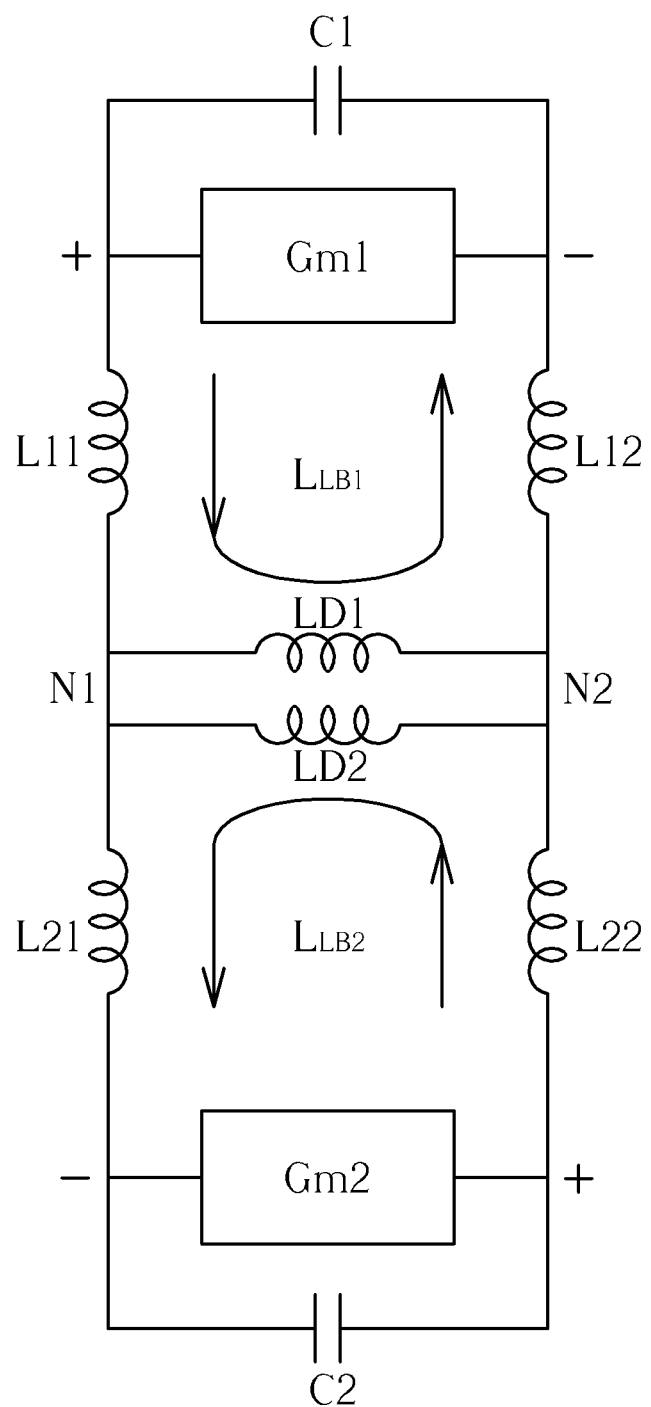
FIG. 7C is a diagram illustrating an equivalent circuit of the one-coil dual-core LC oscillator shown in FIG. 4 being set to operate in a low band mode according to an embodiment of the present invention.

FIG. 7C is a diagram illustrating an equivalent circuit of the one-coil dual-core LC oscillator 10 being set to operate in the low band mode according to an embodiment of the present invention. At the low band operation mode, the current flowing between the nodes N1 and N2 via the central wire W2 may exist, and the inductor LD on the central wire W2 may affect an equivalent inductance LLB for the one-coil dual-core LC oscillator 10 operating in the low band mode. More particularly, the one-coil dual-core LC oscillator 10 operating in the low band mode may be regarded as two one-coil one core LC oscillators connected in parallel as shown in FIG. 7C. For a first one-coil one core LC oscillator of the two one-coil one core LC oscillators that is illustrated by the upper-half of FIG. 7C, the central wire W2 shown in FIG. 4 may be regarded as an inductor LD1 (e.g., the central inductor LD), where the first core circuit and the inductors L11 and L12 are similar to that shown in FIG. 6C, and related details are not repeated here for brevity. An inductance for this first one-coil one core LC oscillator (e.g., an inductance of an entirety of the inductors L11, LD1 and L12) may be $L_{HB1}$. For a second one-coil one core LC oscillator of the two one-coil one core LC oscillators that is illustrated by the lower-half of FIG. 7C, the central wire W2 shown in FIG. 4 may be regarded as an inductor LD2 (e.g., the central inductor LD), where the second core circuit and the inductors L21 and L22 are similar to that shown in FIG. 6C, and related details are not repeated here for brevity. An inductance for this second one-coil one core LC oscillator (e.g., an inductance of an entirety of the inductors L21, LD1 and L22) may be $L_{LB1}$. As the inductance of the entirety of the outer wires W11 and W12 is L, each of the inductances $L_{LB1}$ and $L_{LB2}$ may be L, and an equivalent inductance LLB for the one-coil dual-core LC oscillator 10 may be (L/2).

It should be noted that the main coil and the mutual coil can be implemented on different metal layer. In some embodiments, the main coil and the mutual coil can be overlapped in a normal vector direction of any of the metal layers M1, M2, etc., which means the mutual coil will not greatly increase an overall circuit area of the one-coil dual-core LC oscillator 10, but the present invention is not limited thereto.

In the embodiment of FIG. 4, the central wire W2 may be a straight wire routed from the node N1 of the outer wire W11 to the node N2 of the outer wire W12. More particularly, the embodiment of FIG. 4 may make a tuning range of the high band mode and a tuning range of the low band mode be substantially continuous without greatly overlapping each other, but the present invention is not limited thereto. For example, the tuning range of the low band mode may be 6.6 gigahertz (GHz) to 9.6 GHz and the tuning range of the high band mode may be 9.6 GHz to 14 GHz. In some embodiments, the central wire W2 may be implemented to have an inductance higher than that implemented by the straight wire or an inductance lower than that implemented by the straight wire.

In one embodiment, the architecture of the main coil of the one-coil dual core LC oscillator 10 may be replaced with that shown in FIG. 1B. As mentioned in the embodiment of FIG. 1B, as the length of the central wire W2 (e.g., an entirety of the first segment W21, the intermediate segment W2C and the second segment W22) of the architecture shown in FIG. 1B can be increased in comparison with that shown in the embodiment of FIG. 1A, and the inductance of the central inductor LD can be accordingly increased, which makes the tuning range of the low band mode be shifted to a lower frequency band. More particularly, adopting the architecture shown in FIG. 1B can make the tuning range of the high band mode and the tuning range of the low band mode be separated from each other, but the present invention is not limited thereto. For example, the tuning range of the low band mode may be 3.6 GHz to 5.4 GHz and the tuning range of the high band mode may be 9.6 GHz to 14 GHz. Note that adopting the architecture show in FIG. 1D can achieve similar effect, and related detail will not be repeated here for brevity.

In one embodiment, the architecture of the main coil of the one-coil dual core LC oscillator 10 may be replaced with that shown in FIG. 1C. As mentioned in the embodiment of FIG. 1C, the equivalent inductance of the central wire which comprises the ringed wires WR1 and WR2 can be reduced in comparison with the central wire W2 shown in the embodiment of FIG. 1A. Thus, in comparison with utilizing the architecture shown in FIG. 1A, the central wire W2 (e.g., an entirety of the ringed wires WR1 and WR2) shown in FIG. 1C can makes the tuning range of the low band mode of the one-coil dual core LC oscillator 10 be shifted to a higher frequency band. More particularly, the embodiment of FIG. 1C can make the tuning range of the high band mode and the tuning range of the low band mode of the one-coil dual core LC oscillator 10 overlap each other, but the present invention is not limited thereto. For example, the tuning range of the low band mode of the one-coil dual core LC oscillator 10 may be 10 GHz to 13 GHz and the tuning range of the high band mode of the one-coil dual core LC oscillator 10 may be 11 GHz to 14 GHz.

Figure 8:
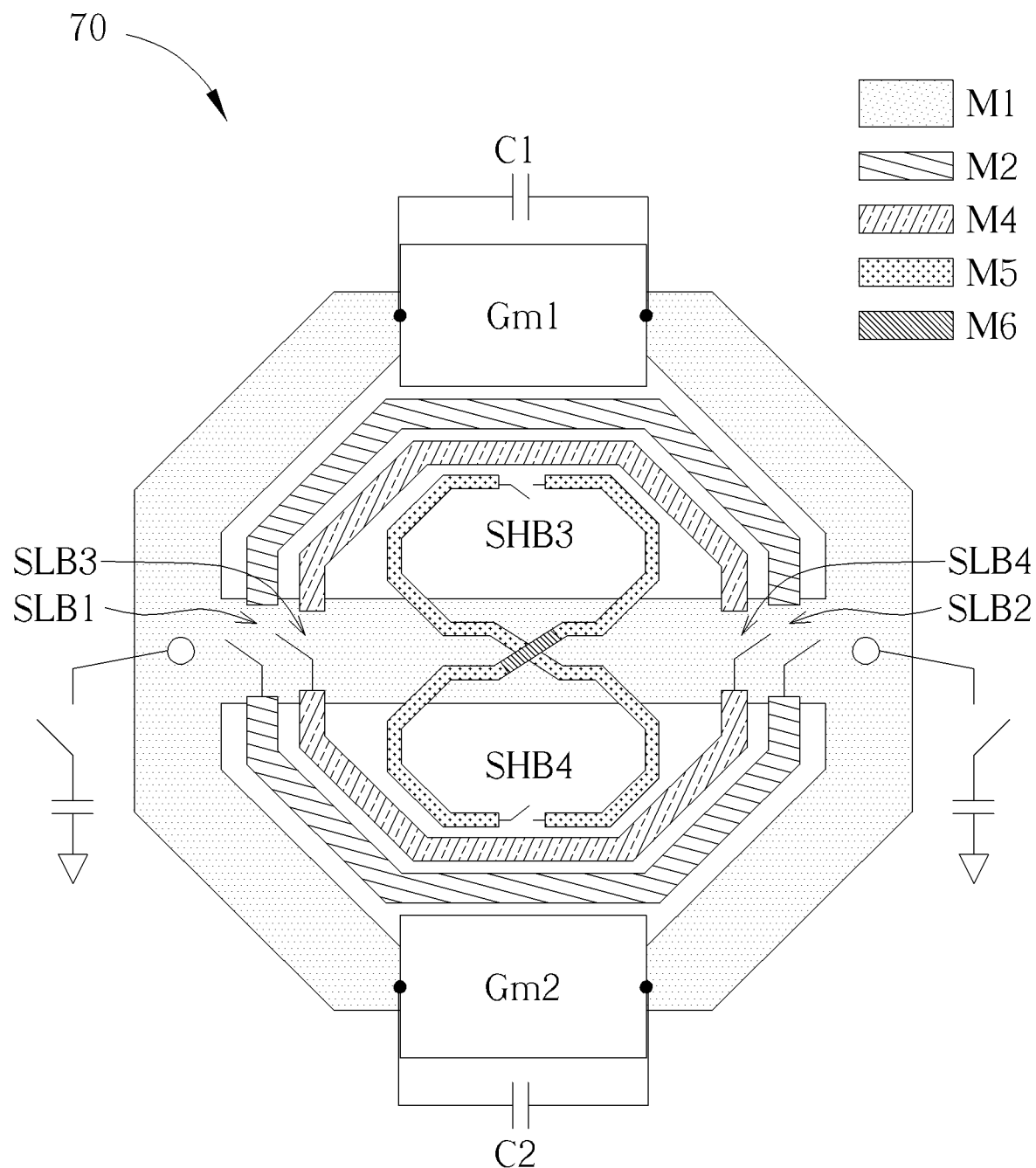
FIG. 8 is a diagram illustrating a one-coil dual-core LC oscillator according to an embodiment of the present invention.

FIG. 8 is a diagram illustrating a one-coil dual-core LC oscillator 70 according to an embodiment of the present invention. The one-coil dual-core LC oscillator 70 may be an example of superposition of the embodiments of FIG. 2A, FIG. 2B and FIG. 3B, where some symbols of the components which are described in previous embodiments are omitted in FIG. 8 for brevity. As shown in FIG. 8, the one-coil dual-core LC oscillator 70 may comprise a first mutual coil illustrated by the metal layer M2 and a second mutual coil illustrated by the metal layer M4 as mentioned in the embodiment of FIG. 3B. The first mutual coil and second mutual coil are placed along the outer wires W11 and W12 (which can be above, below, or nearby outer wire). Each of the first mutual coil and the second mutual coil is controlled by the second set of switches (e.g., the switches SLB1, SLB2, SLB3 and SLB4 of the second set of switches). In addition, the one-coil dual-core LC oscillator 70 may further comprise the twisted coil mentioned in the embodiment of FIG. 2B, illustrated by the metal layers M5 and M6, are placed along the outer wires W11 and W12 (which can be above, below, or nearby outer wire), where the twisted is controlled by the first set of switches (e.g., the switches SHB3 and SHB4 of the first set of switches). More particularly, the switches SHB3 and SHB4 are configured to control whether to generate a close loop of the twisted coil.

For example, each of the switches SHB3 and SHB4 is connected in series with the metal layer M5 on the close loop of the twisted coil.

In detail, when the one-coil dual-core LC oscillator 70 is set to operate in the high band mode, the first set of switches (e.g., the switches SHB3 and SHB4) are turned on to generate the close loop of the twisted coil; and when the one-coil dual-core LC oscillator 70 is set to operate in the low band mode, the first set of switches (e.g., the switches SHB3 and SHB4) are turned off to prevent generating the close loop of the twisted coil. It should be noted that when the one-coil dual-core LC oscillator 70 is set to operate in the high band mode, a mutual current on the close loop of the twisted coil (e.g., an induced current generated in response to the upper-half current loop and the lower-half current loop on the main coil based on Lenz's law) can be generated. It should be noted that once the mutual current on the close loop of the twisted coil is generated, when the mutual current flowing on a first portion (e.g., an upper-half portion shown in FIG. 8) of the twisted coil is in a clockwise direction, the mutual current flowing on a second portion (e.g., a lower-half portion shown in FIG. 8) of the twisted coil is in a counterclockwise direction; and when the mutual current flowing on the first portion (e.g., an upper-half portion shown in FIG. 8) of the twisted coil is in a counterclockwise direction, the mutual current flowing on the second portion (e.g., a lower-half portion shown in FIG. 8) of the twisted coil is in a clockwise direction. Thus, the current from the first core circuit to the second core circuit or the current from the second core circuit to the first core circuit (e.g., the forbidden mode of the one-coil dual-core LC oscillator 70 being set in the high band mode) can be further suppressed with aid of the twisted coil.

It should be noted that the implementation of the main coil of the one-coil dual-core LC oscillator 70 is not limited to that shown in FIG. 8. For example, the main coil of the one-coil dual-core LC oscillator 70 may be implemented according to the architecture illustrated in any of the embodiments of FIG. 1A to FIG. 1E. In addition, the control of the first set of switches and the second set of switches described in this embodiment is for illustrative purposes only, and is not meant to be a limitation of the present invention. For example, the first set of switches do not have to be turned off when the second set of switches are turned on, and the second set of switches do not have to be turned off when the first set of switches are turned on. In some embodiment, the first set of switches and the second set of switches may be turned on together or turned off together.

Figure 9:
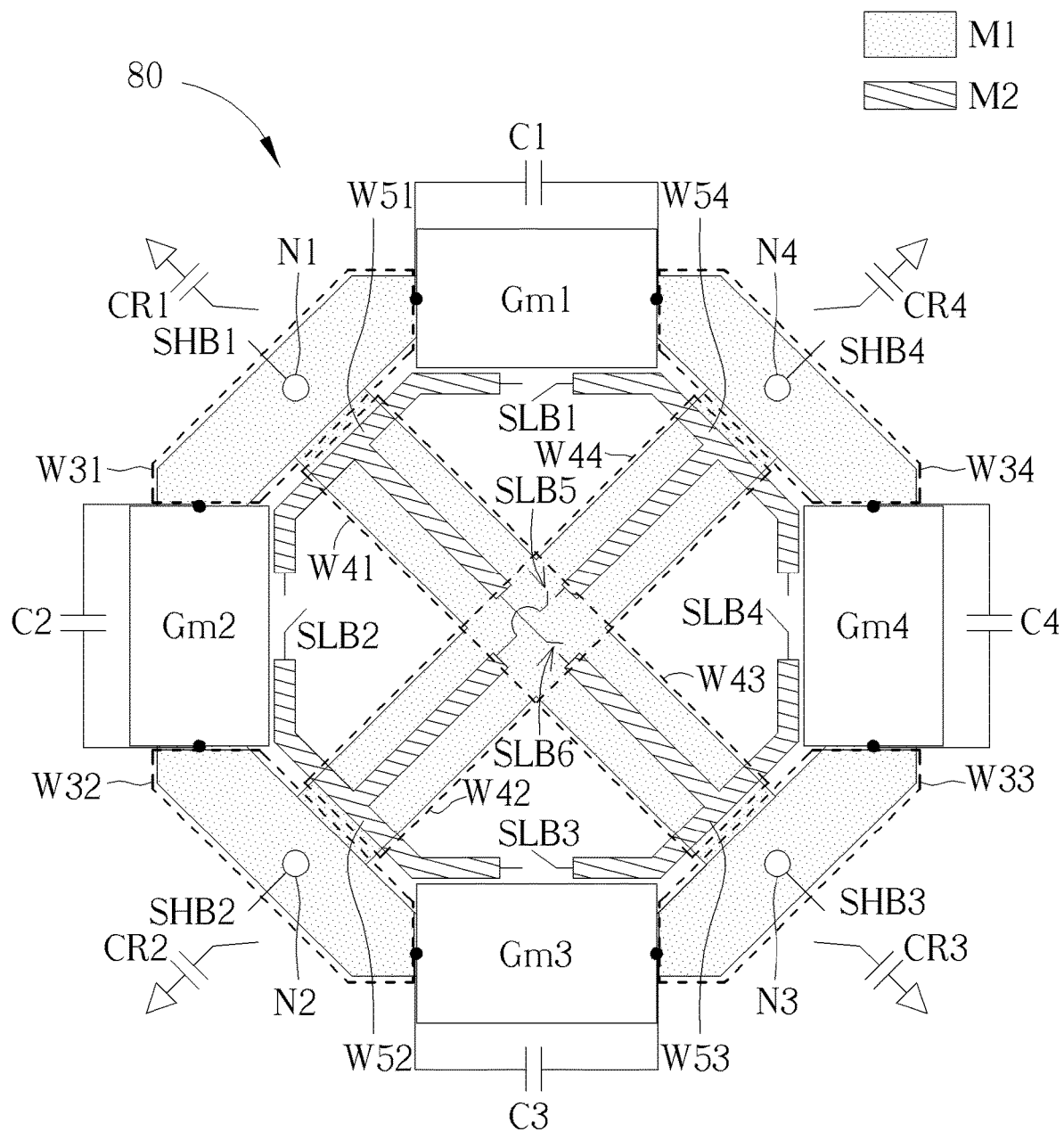
FIG. 9 is a diagram illustrating a one-coil quad-core LC oscillator according to an embodiment of the present invention.

The concept illustrated in the embodiment of FIG. 4 may be adopted in a one-coil quad-core LC oscillator, which can further reduce the equivalent inductance and thereby improve the phase noise reduction without degrading the quality factor. FIG. 9 is a diagram illustrating a one-coil quad-core LC oscillator 80 according to an embodiment of the present invention. As shown in FIG. 9, the one-coil quad-core LC oscillator 80 may comprise four core circuits, where each of the four core circuits may comprise a transconductance device (e.g., Gm1, Gm2, Gm3 or Gm4) and a tank capacitor (e.g., C1, C2, C3 or C4). Implementations of each of the four core circuits of this embodiment are similar to each of the first core circuit and the second core circuit in previous embodiment, and related details are not repeated here for brevity. In addition, the one-coil quad-core LC oscillator 80 may further comprise a main coil which is illustrated by the metal layer M1, a mutual coil (e.g., an entirety of segments W51, W52, W53 and W54) which is illustrated by the metal layer M2, and resonance capacitors CR1, CR2, CR3 and CR4. The main coil of the one-coil quad-core LC oscillator 80 may comprise an outer wire (e.g., an entirety of segments W31, W32, W33 and W34 shown in FIG. 9) coupled to the four core circuits (e.g., the transconductance devices Gm1, Gm2, Gm3 and Gm4 and the tank capacitors C1, C2, C3, C4) and a central wire (e.g., an entirety of segments W41, W42, W43 and W44 shown in FIG. 9) coupled between nodes N1, N2, N3 and N4 of the outer wire.

In detail, the segment W31 of the outer wire is coupled between the first core circuit and second core circuit, the segment W32 of the outer wire is coupled between the second core circuit and third core circuit, the segment W33 of the outer wire is coupled between the third core circuit and fourth core circuit, and the segment W34 of the outer wire is coupled between the fourth core circuit and first core circuit, where the segment W31 of the outer wire comprise the node N1, the segment W32 of the outer wire comprise the node N2, the segment W33 of the outer wire comprise the node N3, and the segment W34 of the outer wire comprise the node N4. The segment W41 of the central wire is coupled between the node N1 of the outer wire and a central node of the central wire, the segment W42 of the central wire is coupled between the node N2 of the outer wire and a central node of the central wire, the segment W43 of the central wire is coupled between the node N3 of the outer wire and a central node of the central wire, and the segment W44 of the central wire is coupled between the node N4 of the outer wire and a central node of the central wire. The segment W51 of the mutual coil is placed along the segment W31 of the outer wire and the segment W41 of the central wire, the segment W52 of the mutual coil is placed along the segment W32 of the outer wire and the segment W42 of the central wire, the segment W53 of the mutual coil is placed along the segment W33 of the outer wire and the segment W43 of the central wire, and the segment W54 of the mutual coil is placed along the segment W34 of the outer wire and the segment W44 of the central wire.

The resonance capacitors CR1, CR2, CR3 and CR4 may be controlled by a first set of switches (which is turned on in response to the one-coil quad-core LC oscillator 80 being set to operate in the high band mode and is turned off in response to the one-coil quad-core LC oscillator 80 being set to operate in the low band mode) such as switches SHB1, SHB2, SHB3 and SHB4. The mutual coil may be controlled by a second set of switches (which is turned on in response to the one-coil quad-core LC oscillator 80 being set to operate in the low band mode and is turned off in response to the one-coil quad-core LC oscillator 80 being set to operate in the high band mode) such as switches SLB1, SLB2, SLB3, SLB4, SLB5 and SLB6. In detail, the switch SHB1 is coupled between the node N1 and the resonance capacitor CR1, the switch SHB2 is coupled between the node N2 and the resonance capacitor CR2, the switch SHB3 is coupled between the node N3 and the resonance capacitor CR3, and the switch SHB4 is coupled between the node N4 and the resonance capacitor CR4. In addition, the switch SLB1 is coupled between a first port of the segment W51 of the mutual coil and a second port of the segment W54 of the mutual coil, the switch SLB2 is coupled between a first port of the segment W52 of the mutual coil and a second port of the segment W51 of the mutual coil, the switch SLB3 is coupled between a first port of the segment W53 of the mutual coil and a second port of the segment W52 of the mutual coil, the switch SLB4 is coupled between a first port of the segment W54 of the mutual coil and a second port of the segment W53 of the mutual coil, the switch SLB5 is coupled between a third port of the segment W52 of the mutual coil and a third port of the segment W54 of the mutual coil, and the switch SLB6 is coupled between a third port of the segment W51 of the mutual coil and a third port of the segment W53 of the mutual coil.

For the one-coil quad-core LC oscillator 80 being set to operate in any of the high band mode and the low band mode, there are multiple modes (which comprises one operation mode that is wanted and multiple forbidden mode that is unwanted) coexist on the main coil of the one-coil quad-core LC oscillator 80 with respect to different electrode polarity definitions of each of the four core circuits. Some of the forbidden modes may be canceled or suppressed by each other due to quality factor self-damping, and the operation mode is therefore not greatly impacted by these forbidden modes, where the remaining forbidden modes can be suppressed with aid of the resonance capacitors {CR1, CR2, CR3, CR4} or the mutual coil.

In this embodiment, the one-coil quad-core LC oscillator 80 may be regarded as four one-core LC oscillators (which respectively corresponding to the four core circuits) connected in parallel. For better illustration, assume that an inductance of an entirety of the outer wires (e.g., the entirety of the segments W31, W32, W33 and W34) is L. When the one-coil quad-core LC oscillator 80 is set to operate in the high band mode, the first set of switches (e.g., the switches SHB1, SHB2, SHB3 and SHB4) are turned on and the second set of switches (e.g., the switches SLB1, SLB2, SLB3, SLB4, SLB5 and SLB6) are tuned off. For a one-core LC oscillator corresponding to the first core circuit, as the nodes N1 and N4 are virtual short, an equivalent inductance of the one-core LC oscillator corresponding to the first core circuit may be (L/4), which is provided by a half of the segment W31 and a half of the segment W34 of the outer wire, where the rest of one-core LC oscillators respectively corresponding to the second, third, and fourth core circuit may be deduced by analogy. As the equivalent inductance of each of the four one-core LC oscillators respectively corresponding to each of the four core circuits is (L/4), an overall equivalent inductance of the one-coil quad-core LC oscillator 80 being set to operate in the high band mode may be (L/16).

When the one-coil quad-core LC oscillator 80 is set to operate in the low band mode, the first set of switches (e.g., the switches SHB1, SHB2, SHB3 and SHB4) are turned off and the second set of switches (e.g., the switches SLB1, SLB2, SLB3, SLB4, SLB5 and SLB6) are turned on. For a one-core LC oscillator corresponding to the first core circuit, as the nodes N1 and N4 are not virtual short, which means inductances on the segments W41 and W44 may take effect, an equivalent inductance of the one-core LC oscillator corresponding to the first core circuit may be (L/2), which is provided by a half of the segment W31, a half of the segment W34 of the outer wire, the segment W41 of the central wire and the segment W44 of the central wire, where the rest of one-core LC oscillators respectively corresponding to the second, third, and fourth core circuit may be deduced by analogy. As the equivalent inductance of each of the four one-core LC oscillators respectively corresponding to each of the four core circuits is (L/2), an overall equivalent inductance of the one-coil quad-core LC oscillator 80 being set to operate in the low band mode may be (L/8).

It should be noted that the main coil of the one-coil quad-core LC oscillator 80 is not limited to that shown in FIG. 9. For example, any of the segments W41, W42, W43 and W44 of the central wire of the one-coil quad-core LC oscillator 80 may be implemented according to the architecture of the twisted wire as illustrated in the embodiment of FIG. 1B. In another example, any of the segments W41, W42, W43 and W44 of the central wire of the one-coil quad-core LC oscillator 80 may be implemented according to the architecture of the ringed wires connected in series as illustrated in the embodiment of FIG. 1C. In another example, any of the segments W41, W42, W43 and W44 of the central wire of the one-coil quad-core LC oscillator 80 may be implemented according to the architecture of the S-serpentine wires as illustrated in the embodiment of FIG. 1D. In addition, the control of the first set of switches (e.g., the switches SHB1, SHB2, SHB3 and SHB4) and the second set of switches (e.g., the switches SLB1, SLB2, SLB3, SLB4, SLB5 and SLB6) described in this embodiment is for illustrative purposes only, and is not meant to be a limitation of the present invention. For example, the first set of switches do not have to be turned off when the second set of switches are turned on, and the second set of switches do not have to be turned off when the first set of switches are turned on. In some embodiment, the first set of switches and the second set of switches may be turned on together or turned off together.

In the embodiment of FIG. 9, four transconductance devices are utilized to drive the LC load of the one-coil quad-core LC oscillator 80 (e.g., one transconductance device per core circuit), but the present invention is not limited thereto. In some embodiment, the one-coil quad-core LC oscillator 80 may utilize a single transconductance device to drive the whole LC load; for example, one of the transconductance devices Gm1, Gm2, Gm3 and Gm4 (e.g., Gm1) are configured to drive the whole LC load, and the rest (e.g., Gm2, Gm3 and Gm4) may be omitted. In some embodiment, the one-coil quad-core LC oscillator 80 may utilize two transconductance device to drive the whole LC load; for example, any two of the transconductance devices Gm1, Gm2, Gm3 and Gm4 (e.g., Gm1 and Gm3) are configured to drive the whole LC load, and the rest (e.g., Gm2 and Gm4) may be omitted. Note that the layout of the transconductance devices is preferably to be symmetric. For example, the transconductance devices Gm1 and Gm3 are kept and the transconductance devices Gm2 and Gm4 are omitted. In some embodiment, the layout of the transconductance devices does not have to be symmetric. For example, the transconductance devices Gm1 and Gm2 are kept and the transconductance devices Gm3 and Gm4 are omitted. In some embodiment, the one-coil quad-core LC oscillator 80 may utilize three transconductance devices to drive the whole LC load; for example, any three of the transconductance devices Gm1, Gm2, Gm3 and Gm4 (e.g., Gm1, Gm2 and Gm3) are configured to drive the whole LC load, and the rest (e.g., Gm4) may be omitted.

Figure 10:
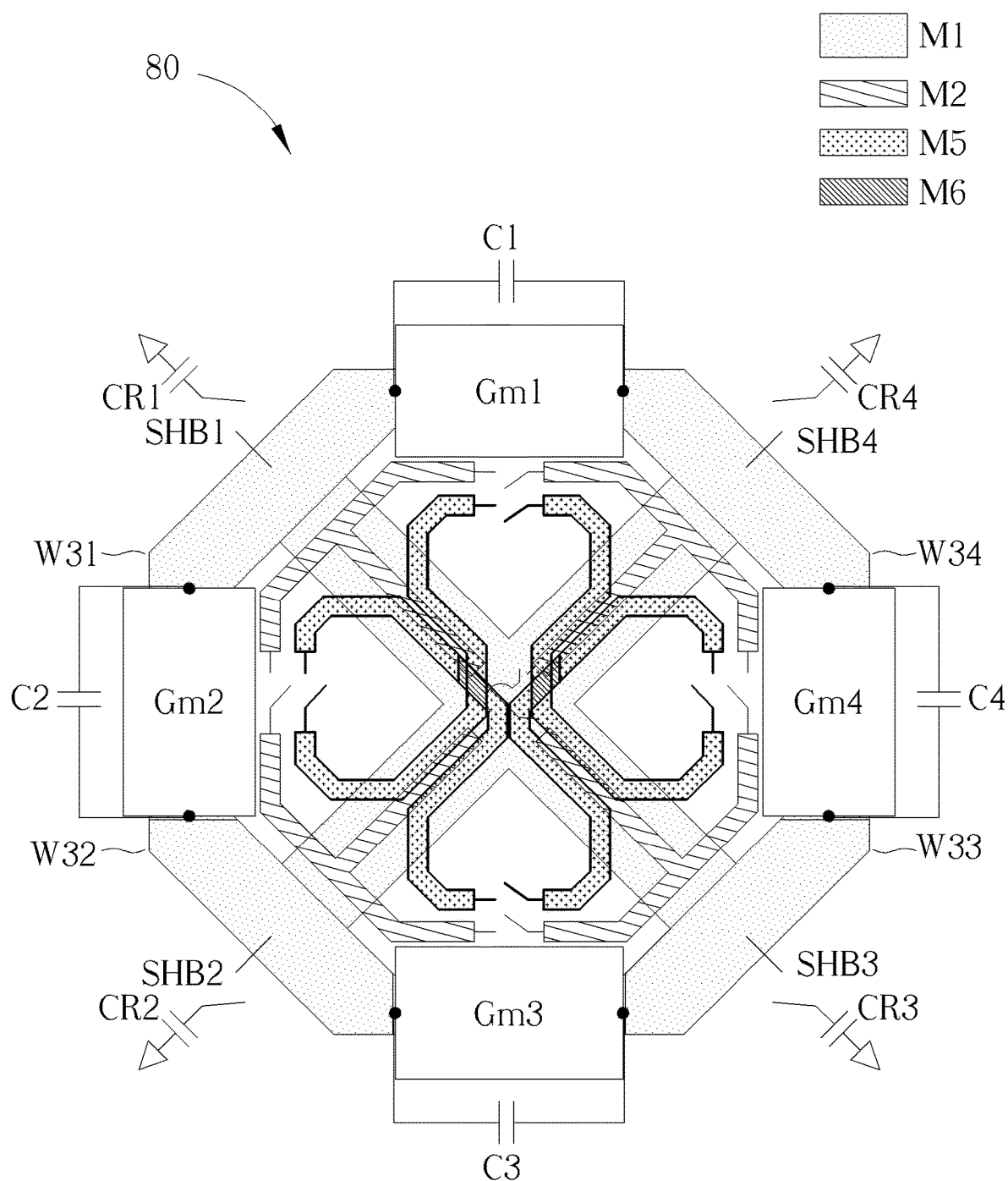
FIG. 10 is a diagram illustrating a one-coil quad-core LC oscillator according to an embodiment of the present invention.

In addition, the technique of suppressing the low band mode by a twisted mutual coil (which is illustrated in the embodiment of FIG. 2B) may be applied to the one-coil quad-core LC oscillator 80. As shown in FIG. 10, the one-coil quad-core LC oscillator 80 may further comprise a twisted mutual coil which is illustrated by the metal layers M5 and M6. Note that the segments W41, W42, W43 and W44 of the central wire may divide the main coil into four portions. Each of the four portions may correspond to an inner loop of the main coil. A first segment of the twisted mutual coil (e.g., an upper quarter of the twisted mutual coil) may be routed in a counterclockwise direction, a second segment of the twisted mutual coil (e.g., a left-side quarter of the twisted mutual coil) may be routed in a clockwise direction, a third segment of the twisted mutual coil (e.g., a lower quarter of the twisted mutual coil) may be routed in the counterclockwise direction, and a fourth segment of the twisted mutual coil (e.g., a right-side quarter of the twisted mutual coil) may be routed in the clockwise direction are placed to be concentric with the main coil (which can be above, below, or nearby the main coil). The effect achieved by the twisted mutual coil of this embodiment is similar to that of the embodiment of FIG. 2B, and is not be repeated here for brevity.

Figure 11:
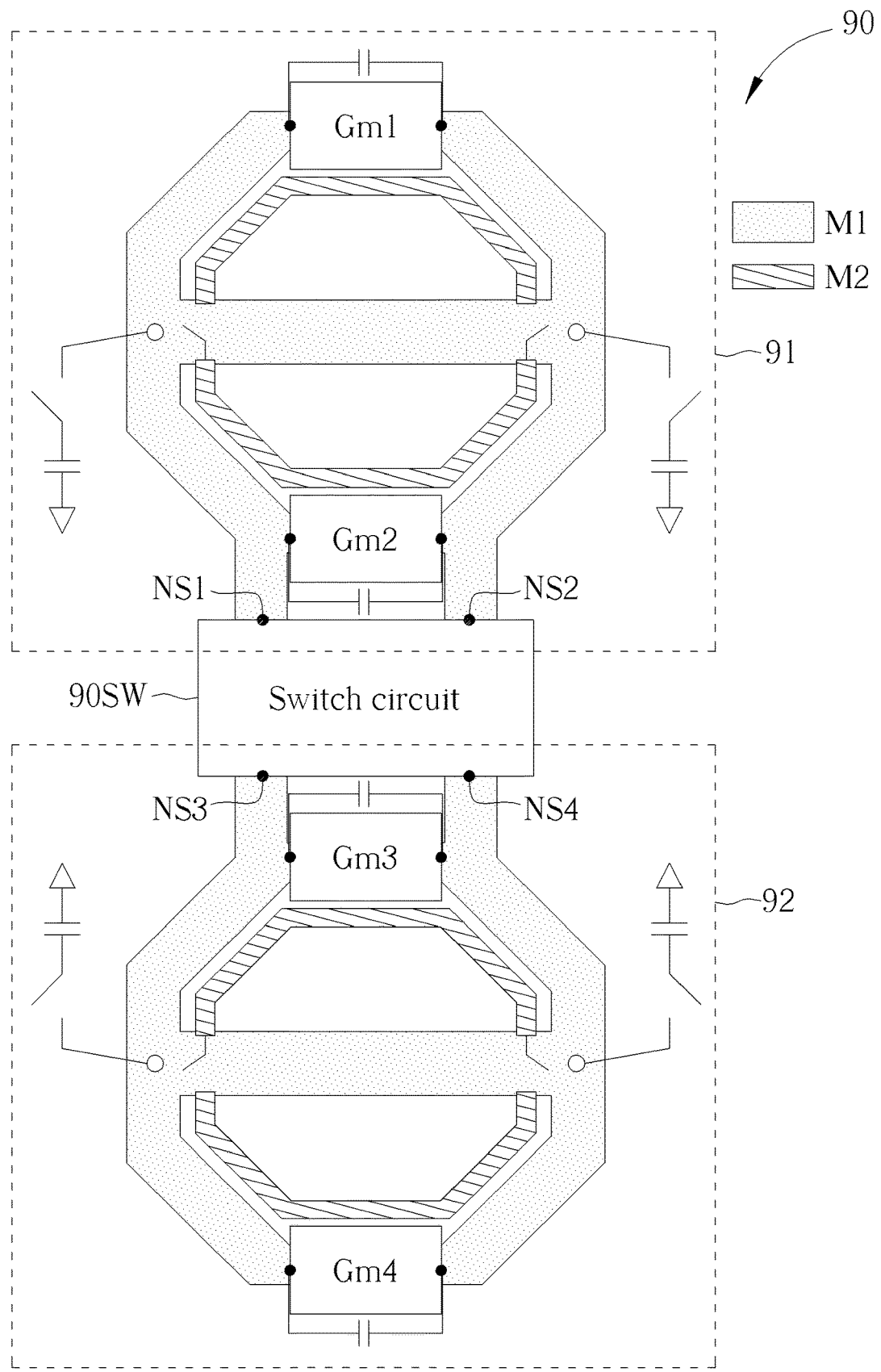
FIG. 11 is a diagram illustrating a dual-coil quad-core LC oscillator 90 according to an embodiment of the present invention.

FIG. 11 is a diagram illustrating a dual-coil quad-core LC oscillator 90 according to an embodiment of the present invention. As shown in FIG. 11, the dual-coil quad-core LC oscillator 90 may comprise a first one-coil multi-core LC oscillator such as a one-coil dual-core LC oscillator 91, a second one-coil multi-core LC oscillator such as a one-coil dual-core LC oscillator 92, and a switch circuit 90SW coupled between the one-coil dual-core LC oscillator 91 and the one-coil dual-core LC oscillator 92. For example, the switch circuit 90SW may be coupled to the one-coil dual-core LC oscillator 91 via ports NS1 and NS2, and the switch circuit 90SW may be coupled to the one-coil dual-core LC oscillator 92 via ports NS3 and NS4. In some embodiments, the switch circuit 90SW may comprise a first switch coupled between the ports NS1 and NS4, and further comprise a second switch coupled between the ports NS2 and NS3, but the present invention is not limited thereto.

In this embodiment, any (e.g., each) of the one-coil dual-core LC oscillator 91 and the one-coil dual-core LC oscillator 92 may be an example of the one-coil dual-core LC oscillator 10 shown in FIG. 4. According to the previous descriptions, an equivalent inductance of each of the one-coil dual-core LC oscillator 91 and the one-coil dual-core LC oscillator 92 may be (L/4) when the dual-coil quad-core LC oscillator 90 is set to operate in the high band mode, and the equivalent inductance of each of the one-coil dual-core LC oscillator 91 and the one-coil dual-core LC oscillator 92 may be (L/2) when the dual-coil quad-core LC oscillator 90 is set to operate in the low band mode. According to requirement of phase noise reduction, the switch circuit 90SW (e.g., the first and the second switches) may be turned on to make the one-coil dual-core LC oscillator 91 and the one-coil dual-core LC oscillator 92 be connected in parallel, where an equivalent inductance of the dual-coil quad-core LC oscillator 90 may be (L/8) when the dual-coil quad-core LC oscillator 90 is set to operate in the high band mode, and the equivalent inductance of the dual-coil quad-core LC oscillator 90 may be (L/4) when the dual-coil quad-core LC oscillator 90 is set to operate in the low band mode. According to requirement of current saving, the switch circuit 90SW (e.g., the first and the second switches) may be turned off to make the one-coil dual-core LC oscillator 91 and the one-coil dual-core LC oscillator 92 be disconnected, and the one-coil dual-core LC oscillator 92 may be disabled (e.g., powered off), where the equivalent inductance of the dual-coil quad-core LC oscillator 90 may be (L/4) when the dual-coil quad-core LC oscillator 90 is set to operate in the high band mode, and the equivalent inductance of the dual-coil quad-core LC oscillator 90 may be (L/2) when the dual-coil quad-core LC oscillator 90 is set to operate in the low band mode.

In the embodiment of FIG. 11, four transconductance devices are utilized to drive the LC load of the dual-coil quad-core LC oscillator 90 (e.g., one transconductance device per core circuit), but the present invention is not limited thereto. In some embodiment, the one-coil quad-core LC oscillator 80 may utilize a single transconductance device to drive the whole LC load; for example, one of the transconductance devices Gm1, Gm2, Gm3 and Gm4 (e.g., Gm1) are configured to drive the whole LC load, and the rest (e.g., Gm2, Gm3 and Gm4) may be omitted. In some embodiment, the dual-coil quad-core LC oscillator 90 may utilize two transconductance device to drive the whole LC load; for example, any two of the transconductance devices Gm1, Gm2, Gm3 and Gm4 (e.g., Gm2 and Gm3) are configured to drive the whole LC load, and the rest (e.g., Gm1 and Gm4) may be omitted. Note that the layout of the transconductance devices is preferably to be symmetric. For example, the transconductance devices Gm2 and Gm3 are kept and the transconductance devices Gm1 and Gm4 are omitted, or the transconductance devices Gm1 and Gm4 are kept and the transconductance devices Gm2 and Gm3 are omitted. In some embodiment, the layout of the transconductance devices does not have to be symmetric. For example, the transconductance devices Gm1 and Gm2 are kept and the transconductance devices Gm3 and Gm4 are omitted. In some embodiment, the one-coil quad-core LC oscillator 80 may utilize three transconductance devices to drive the whole LC load; for example, any three of the transconductance devices Gm1, Gm2, Gm3 and Gm4 (e.g., Gm1, Gm2 and Gm3) are configured to drive the whole LC load, and the rest (e.g., Gm4) may be omitted.

The above embodiments utilize multiple metal layers to represent various coils, wires or segments. However, it is for illustrative purposes only, and is not meant to be a limitation of the present invention. Components illustrated by different metal layers shown in figures are only for the purposes of better understanding the routing/wiring of these components and better recognizing different components, where these components do not have to be implemented by different metal layers. As long as the overall electrical behaviors are substantially the same, these components may be implemented on the same metal layer or different metal layers, and these alternative designs should belong to the scope of the present invention.

To summarize, the multi-core LC oscillator provided by the embodiments of the present invention can reduce the equivalent inductance thereof with aid of the multi-core architecture, to thereby reduce the phase noise without greatly increase overall costs (e.g., the circuit area). Various types of the main coil are also provided in order to overcome the bottleneck of the inductance ratio of the related art. Furthermore, the resonance capacitors and the mutual coil can be utilized in the high band mode and the low band mode, respectively, in order to suppress coexisting forbidden mode(s). Thus, the tuning range of the multi-core LC oscillator can be switchable without mode ambiguity, and thereby effectively extend an overall tuning range. In addition, the embodiment of the present invention will not greatly increase overall costs (e.g., the circuit area). Thus, the present invention can improve the phase noise reduction and increase the overall tuning range without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A one-coil multi-core inductor-capacitor (LC) oscillator, comprising:
    a main coil, comprising:

an outer wire, coupled to a first core circuit and a second core circuit of the one-coil multi-core LC oscillator; and a central wire, coupled between a first node and a second node of the outer wire;

wherein an outer loop formed by the outer wire corresponds to a first mode of the one-coil multi-core LC oscillator, and inner loops formed by the outer wire and the central wire correspond to a second mode of the one-coil multi-core LC oscillator; and at least one mode suppression device, configured to suppress one of the first mode and the second mode, wherein the at least one mode suppression device comprises:

multiple resonance capacitors, configured to be coupled to the central wire for suppressing the second mode, in order to make the one-coil multi-core LC oscillator operate in the first mode.

2. The one-coil multi-core LC oscillator of claim 1, wherein each of the multiple resonance capacitors is a switchable capacitor circuit which provides a switchable capacitance.

3. The one-coil multi-core LC oscillator of claim 1, wherein a multi-coil multi-core LC oscillator comprises:
a first one-coil multi-core LC oscillator;
a second one-coil multi-core LC oscillator; and
a switch circuit, coupled between the first one-coil multi-core LC oscillator and the second one-coil multi-core LC oscillator, configured to control whether to make the first one-coil multi-core LC oscillator and the second one-coil multi-core LC oscillator be connected in parallel;
wherein any of the first one-coil multi-core LC oscillator and the second one-coil multi-core LC oscillator comprises the one-coil multi-core LC oscillator.

4. A one-coil multi-core inductor-capacitor (LC) oscillator, comprising:
a main coil, comprising:
an outer wire, coupled to a first core circuit and a second core circuit of the one-coil multi-core LC oscillator; and
a central wire, coupled between a first node and a second node of the outer wire;
wherein an outer loop formed by the outer wire corresponds to a first mode of the one-coil multi-core LC oscillator, and inner loops formed by the outer wire and the central wire correspond to a second mode of the one-coil multi-core LC oscillator; and
at least one mode suppression device, configured to suppress one of the first mode and the second mode, wherein the at least one mode suppression device comprises:
a twisted mutual coil, configured to form a close loop for suppressing the second mode, in order to make the one-coil multi-core LC oscillator operate in the first mode, wherein a first segment of the twisted mutual coil and a second segment of the twisted mutual coil are placed to be concentric with the main coil.

5. The one-coil multi-core LC oscillator of claim 4, wherein the at least one mode suppression device further comprises:
at least one capacitor, connected in series with the twisted mutual coil.

6. The one-coil multi-core LC oscillator of claim 5, wherein each of the at least one capacitor is a switchable capacitor which provides a switchable capacitance.

7. A one-coil multi-core inductor-capacitor (LC) oscillator, comprising:
a main coil, comprising:
an outer wire, coupled to a first core circuit and a second core circuit of the one-coil multi-core LC oscillator; and
a central wire, coupled between a first node and a second node of the outer wire;
wherein an outer loop formed by the outer wire corresponds to a first mode of the one-coil multi-core LC oscillator, and inner loops formed by the outer wire and the central wire correspond to a second mode of the one-coil multi-core LC oscillator; and
at least one mode suppression device, configured to suppress one of the first mode and the second mode, wherein the at least one mode suppression device comprises:
a mutual coil, configured to form a close loop for suppressing the first mode, in order to make the one-coil multi-core LC oscillator operate in the second mode;
wherein the mutual coil is placed to be concentric with the main coil.

8. The one-coil multi-core LC oscillator of claim 7, wherein the mutual coil comprises a first mutual coil and a second mutual coil, and each of the first mutual coil and the second mutual coil is placed to be concentric with the main coil.

9. The one-coil multi-core LC oscillator of claim 7, wherein the at least one mode suppression device comprises:
at least one capacitor, connected in series with the mutual coil.

10. The one-coil multi-core LC oscillator of claim 9, wherein each of the at least one capacitor is a switchable capacitor which provides a switchable capacitance.

11. A one-coil multi-core inductor-capacitor (LC) oscillator, comprising:
a main coil, comprising:
an outer wire, coupled to a first core circuit and a second core circuit of the one-coil multi-core LC oscillator, and
a central wire, coupled between a first node and a second node of the outer wire,
wherein an outer loop formed by the outer wire corresponds to a first mode of the one-coil multi-core LC oscillator, and inner loops formed by the outer wire and the central wire correspond to a second mode of the one-coil multi-core LC oscillator, and
at least one mode suppression device, configured to suppress one of the first mode and the second mode, wherein:
a first segment of the outer wire is coupled between the first core circuit and the second core circuit, a second segment of the outer wire is coupled between the second core circuit and a third core circuit, a third segment of the outer wire is coupled between the third core circuit and a fourth core circuit, and a fourth segment of the outer wire is coupled between the fourth core circuit and the first core circuit, wherein the first segment of the outer wire comprise the first node, the second segment of the outer wire comprise the second node, the third segment of the outer wire comprise a third node, and the fourth segment of the outer wire comprises a fourth node; and
a first segment of the central wire is coupled between the first node of the outer wire and a central node of the central wire, a second segment of the central wire is coupled between the second node of the outer wire and the central node of the central wire, a third segment of the central wire is coupled between the third node of the outer wire and the central node of the central wire, and a fourth segment of the central wire is coupled between the fourth node of the outer wire and the central node of the central wire.

12. The one-coil multi-core LC oscillator of claim 11, wherein the at least one mode suppression device comprises a first resonance capacitor, a second resonance capacitor, a third resonance capacitor and a fourth resonance capacitor;
and the first resonance capacitor, the second resonance capacitor, the third resonance capacitor and the fourth resonance capacitor are configured to be respectively coupled to the first segment, the second segment, the third segment and the fourth segment of the central wire for suppressing the second mode, in order to make the one-coil multi-core LC oscillator operate in the first mode.

13. The one-coil multi-core LC oscillator of claim 11, wherein the at least one mode suppression device comprises:

a mutual coil, configured to suppress the first mode, in order to make the one-coil multi-core LC oscillator operate in the second mode;
wherein a first segment of the mutual coil, a second segment of the mutual coil, a third segment of the mutual coil, and a fourth segment of the mutual coil are placed to be concentric with main coil.

14. The one-coil multi-core LC oscillator of claim 13, wherein when the one-coil multi-core LC oscillator is set to operate in the second mode, a first port of the first segment of the mutual coil is coupled to a second port of the fourth segment of the mutual coil, a first port of the second segment of the mutual coil is coupled to a second port of the first segment of the mutual coil, a first port of the third segment of the mutual coil is coupled to a second port of the second segment of the mutual coil, a first port of the fourth segment of the mutual coil is coupled to a second port of the third segment of the mutual coil, a third port of the second segment of the mutual coil is coupled to a third port of the fourth segment of the mutual coil, and a third port of the first segment of the mutual coil is coupled to a third port of the third segment of the mutual coil.

* * * * *